(12) United States Patent
Kasama et al.

(10) Patent No.: US 7,755,141 B2
(45) Date of Patent: Jul. 13, 2010

(54) COMPLEMENTARY MISFET FORMED IN A LINEAR BODY

(75) Inventors: Yasuhiko Kasama, Miyagi (JP); Kenji Omote, Miyagi (JP); Noboru Kudo, Miyagi (JP)

(73) Assignee: Ideal Star, Inc., Sendai-Shi (JP)

( * ) Notice: Subject to any disclaimer, the term of this patent is extended or adjusted under 35 U.S.C. 154(b) by 477 days.

(21) Appl. No.: 10/577,526

(22) PCT Filed: Oct. 27, 2004

(86) PCT No.: PCT/JP2004/015934

§ 371 (c)(1),
(2), (4) Date: Mar. 16, 2007

(87) PCT Pub. No.: WO2005/041302

PCT Pub. Date: May 6, 2005

(65) Prior Publication Data

US 2007/0278527 A1 Dec. 6, 2007

(30) Foreign Application Priority Data

| Oct. 29, 2003 | (JP) | ............................. 2003-369228 |
| Oct. 31, 2003 | (JP) | ............................. 2003-371640 |
| Nov. 4, 2003 | (JP) | ............................. 2003-374789 |
| Dec. 5, 2003 | (JP) | ............................. 2003-408349 |

(51) Int. Cl.
  *H01L 27/01* (2006.01)
  *H01L 27/12* (2006.01)
  *H01L 31/0392* (2006.01)

(52) U.S. Cl. ..................................... 257/351; 257/369

(58) Field of Classification Search ................. 257/206, 257/E27.062, E21.632, 368–369, 350–351
See application file for complete search history.

(56) References Cited

U.S. PATENT DOCUMENTS

2005/0127363 A1* 6/2005 Nishiki et al. ................. 257/72

FOREIGN PATENT DOCUMENTS

| JP | 9-203910 | 8/1997 |
| JP | 9-266315 | 4/1998 |
| JP | 10-91097 | 4/1998 |
| JP | 2003-174171 | 6/2003 |
| WO | WO 99/00695 | 1/1999 |

* cited by examiner

*Primary Examiner*—Cuong Q Nguyen
(74) *Attorney, Agent, or Firm*—Young & Thompson

(57) ABSTRACT

Integrated circuits such as semiconductor memories, image sensors, PLA's, and the like have been formed on rigid, planar substrates such as silicon substrates. This has resulted in shapes without flexibility and limited applicabilities. Further, since multiple circuit elements are continuously formed on a flat surface, it has been impossible to produce a non-defective semiconductor memory unless all the circuit elements are fabricated without defects, making it difficult to improve a yield. It is thus devised to weave or braid linear devices into a fabric shape to prepare a planar semiconductor memory, or to bundle up linear devices to prepare a linear semiconductor memory. The integrated circuit comprising the linear devices is flexible and light-weighted, and is thus usable in various applications. It becomes possible to prepare an integrated circuit by once fabricating linear devices and selecting only non-defective ones therefrom, thereby enabling an improved production yield of integrated circuits.

10 Claims, 28 Drawing Sheets

(a)

(b)

(c)

(a)

(b)

(c)

US 7,755,141 B2

COMPLEMENTARY MISFET FORMED IN A LINEAR BODY

TECHNICAL FIELD

The present invention relates to a complementary MISFET formed in a linear body, and an integrated circuit.

BACKGROUND ART (Conventional Complementary MISFET)

Integrated circuits constituted of complementary MISFET's having features of lower power consumption, higher integration density, and the like are widely used for a portable type of battery-driven electronic equipment and the like.

FIG. 28(a) is a cross-sectional view showing a structure of a conventional complementary MISFET formed on a planar substrate. The conventional complementary MISFET is constituted of a P-type MISFET formed on an N-type well region 492 and an N-type MISFET formed on a P-type substrate 491. The P-type MISFET is constituted of a gate electrode 499, a P-type drain region 495, and a P-type source region 494, and the source region 494 and well region 492 are electrically connected with each other via an N-type well contact region 493. The N-type MISFET is constituted of a gate electrode 500, an N-type drain region 496, and an N-type source region 497, and the source region 497 and substrate 491 are electrically connected with each other via a P-type substrate contact region 498.

(Conventional Integrated Circuit)

There will be explained structures and functions of a semiconductor memory, an image sensor, and a PLA, as examples of conventional integrated circuits.

(Conventional Semiconductor Memory)

Semiconductor memories are widely used in computers, electronic equipment, and the like, as apparatus for storing electronic information such as programs and data.

FIG. 24(a) is a cross-sectional view of MISFET's formed on a planar substrate constituting a conventional semiconductor memory. Formed on a planar substrate 401 made of silicon or the like, are a plurality of MISFET's comprising gate electrodes 403, gate insulating films 404, source regions 405, and drain regions 406, respectively, in a manner electrically separated by insulative separation regions 402, respectively, formed by a LOCOS method or the like.

FIG. 24(b) is a circuit diagram of a semiconductor memory such as a masked ROM, and FIGS. 25(a) and (b) are plan views of the conventional semiconductor memory corresponding to the circuit diagram shown in FIG. 24(b). In FIGS. 25(a) and (b), each MISFET is constituted of a pattern of a gate electrode, a source region, a drain region, a source contact, and a drain contact. For example, the MISFET arranged at the upper left of FIG. 25(a) is constituted of a pattern of a gate electrode 421, a source region 422, a drain region 423, a source contact 424, and a drain contact 425. The MISFET's are connected to one another by gate wirings such as made of polycrystalline silicon, and source wirings and drain wirings such as made of Al. In FIGS. 25(a) and (b), the gate wirings 421, 431 are formed of a polycrystalline silicon layers common to the gate electrodes, and correspond to word lines 411 of FIG. 24(b), respectively. Both source wirings 426, 436 are connected to a ground potential. Drain wirings 427, 437 correspond to bit lines 412 of FIG. 24(b), respectively.

Recording of information in a masked ROM is achieved by connecting or unconnecting drains and bit lines. FIG. 24(b) shows a connected node 413 where a drain and a bit line 412 is connected, and an unconnected node 414 where a drain and the bit line 412 is unconnected. The planar substrate 401 is to be prepared in a state completed up to MISFET's and a first layer of Al wirings (source wirings). At a stage where data to be stored in the masked ROM is determined, there is prepared a mask of drain contacts 425 or a mask of a second layer of Al wirings 437 to thereby realize a combined logic circuit even by a small number of masking steps, thereby enabling a shortened turn-around-time. FIG. 25(a) corresponds a situation where data has been recorded by a pattern of drain contacts, and FIG. 25(b) corresponds to a situation where data has been stored by a pattern of a second layer of Al wirings.

(Conventional Image Sensor)

Image sensors are each constituted of photodiodes for converting light energy into electrical energy, and MISFET's for accumulating generated electrical energies and for taking them out as electrical signals, and each include one-dimensionally or two-dimensionally arranged pixels having combined photodiodes and MISFET's, respectively, to exhibit a function for taking out light-beams sensed by the pixels as image signals, respectively.

FIG. 26(a) is a cross-sectional view of a MISFET and a photodiode formed on a planar substrate constituting a conventional image sensor, (b) is a part of a circuit diagram of the image sensor, and (c) is a plan view of the conventional image sensor corresponding to (b). Formed on a P-type planar substrate 451 such as made of silicon, are: a MISFET constituted of a gate electrode 456, a gate insulating film 455, an N-type source region 453, and an N-type drain region 454; and a photodiode constituted of the P-type planar substrate 451 and an N-type cathode region 459.

FIG. 26(b) is a circuit diagram of the image sensor, and FIG. 26(c) is a plan view of the conventional image sensor corresponding to the circuit diagram shown in FIG. 26(b). Photodiodes 462 and MISFET's 463 of FIG. 26(b) correspond to patterns 466 and patterns 467 of FIG. 26(c), respectively, and a vertical selection line 464 of FIG. 26(b) corresponds to a gate electrode simultaneously serving as a gate wiring of FIG. 26(c). Further, vertical signal lines 465 of FIG. 26(b) correspond to drain wirings 469 of FIG. 26(c), respectively. Connecting the substrate 451 to a ground potential connects anodes of the photodiodes to the ground potential. Irradiation of light to PN junctions constituting the photodiodes generates electron-positive hole pairs, and generated electrons pass through the N-type cathode regions of the MISFET's and are accumulated in the source regions 453 thereof, respectively. When the MISFET's are turned ON by control of gate voltages, accumulated electrons pass through the drain wirings and transferred to an output circuit of the image sensor.

(Conventional PLA)

PLA's are logic integrated circuits effective for automatized layout design and shortened turn-around-time of design, since arbitrary combined logics can be realized by simply changing wiring patterns on an integrated circuit comprising orderly arranged multiple MISFET's.

FIG. 24(a) is a cross-sectional view of MISFET's formed on a planar substrate constituting a conventional PLA. Formed on a planar substrate 401 made of silicon or the like, are a plurality of MISFET's comprising gate electrodes 403, gate insulating films 404, source regions 405, and drain regions 406, respectively, in a manner electrically separated by insulative separation regions 402, respectively, formed by a LOCOS method or the like.

FIG. 27(a) is a circuit diagram of an AND plane of the PLA, and FIG. 27(b) is a plan view of the conventional PLA corresponding to the circuit diagram shown in FIG. 27(a). Each MISFET is constituted of a pattern of a gate electrode, a source region, a drain region, a source contact, and a drain contact. For example, the MISFET arranged at the upper left of FIG. 27(b) is constituted of a pattern of a gate electrode 474, a source region 475, a drain region 476, a source contact 477, and a drain contact 478. The MISFET's are connected to one another by gate wirings such as made of polycrystalline silicon, and source wirings and drain wirings such as made of Al. In FIG. 27(b), the gate wirings 479 are formed of a polycrystalline silicon layer common to the gate electrodes, and correspond to AND plane input wirings 471 of FIG. 27(a), respectively. All source wirings 480 are connected to a ground potential. Drain wirings 481 correspond to AND plane output wirings 473 of FIG. 27(a), respectively. The planar substrate 401 is to be prepared in a state completed up to MISFET's and a first layer of Al wirings. At a stage where a system to be realized by an integrated circuit is determined, there is prepared a mask of a second layer of Al wirings to thereby realize a combined logic circuit only by one step of masking, thereby enabling a shortened turn-around-time.

DISCLOSURE OF THE INVENTION

Problem To Be Solved By the Invention (Problem of Conventional Complementary MISFET)

In the conventional complementary MISFET's, there is formed a parasitic thyristor of a circuit diagram shown in FIG. 28(b) by a PNP transistor constituted of the source region 494, well region 492, and substrate 491, and an NPN transistor constituted of the source region 497, substrate 491, and well region 492 shown in FIG. 28(a), thereby causing a phenomenon called "latch-up" where an excessively large current is caused to flow between a power source voltage Vdd and a ground voltage Vss due to a trigger action such as a displacement current by fluctuation of the power source voltage, a junction leakage current, or the like. Occurrence of latch-up causes a problem of malfunction of a circuit, and breakage of MISFET's due to overheat. As a method for preventing occurrence of latch-up, (1) there is typically increased a distance between a P-type MISFET and an N-type MISFET. (2) There is also conducted a method for exemplarily forming a large number of well contacts and substrate contacts, connected to power source wirings and ground wirings, so as to stabilize potentials of well regions and substrate regions, respectively. However, both methods result in increased regions which fail to act as circuits, thereby problematically preventing an improvement of degree of integration.

The latch-up is caused not only in the above-mentioned case where N wells are formed on a P-type substrate, but also in a case where P wells are formed on an N-type substrate or a case where both P wells and N wells are formed on a P-type or N-type substrate.

As a method for improving a degree of integration and preventing latch-up, there is known a method for forming a complementary MISFET on a SOI substrate such as shown in FIG. 28(c). The complementary MISFET is constituted of a P-type MISFET formed on an N-type well region 503, and an N-type MISFET formed on a P-type well region 502 formed on an insulative substrate 501. The N-type well region 503 and P-type well region 502 are electrically separated from each other by an insulative trench separation region 504. Although latch-up is not caused even by an improved degree of integration since parasitic thyristors are not formed in structure, there is caused a problem that SOI substrates are expensive as compared to bulk substrates for forming a complementary MISFET having a structure shown in FIG. 28(a), and that the production process of the trench separation region 504 is complicated.

(Problem of Conventional Integrated Circuit)

Conventional integrated circuits have been formed on rigid and planar substrates such as silicon substrates, respectively. This has caused a problem of shapes without flexibility, and limited applicabilities.

Further, since multiple circuit elements are formed on a continuous substrate, it is impossible to exchange only a defective portion with a non-defective one when at least one circuit element is made defective, thereby making a whole device defective. This leads to a problem that it is required to extremely strictly achieve a process management such as improved cleanness so as to produce all circuit elements without defects, and particularly, difficulty in improving a yield is acceleratedly increased in an attempt to upsize a production apparatus.

Moreover, regions for arranging devices have been limited to two-dimensional regions of planar substrates, respectively, thereby causing a problem that degrees of integration are never drastically increased.

Means For Solving the Problem

The present invention (1) resides in a complementary MISFET comprising:

a first linear body including an N-type MISFET and a second linear body including a P-type MISFET; and a separation region arranged between said first linear body and said second linear body.

The present invention (2) resides in the complementary MISFET of the invention (1), wherein each cross section having a plurality of regions for forming the MISFET is continuously or intermittently formed in the longitudinal direction.

The present invention (3) resides in the complementary MISFET of the invention (1) or (2), wherein the linear bodies and/or the separation region are formed of a material made of an organic semiconductor or electroconductive polymer.

The present invention (4) resides in an integrated circuit comprising the complementary MISFET of any one of the inventions (1) through (3).

The present invention (5) resides in a production method of the complementary MISFET of any one of the inventions (1) through (3), the method comprising the step of:

forming the separation region by coating or vapor depositing an insulating material between the plurality of linear bodies.

The present invention (6) resides in a production method of the complementary MISFET of any one of the inventions (1) through (3), the method comprising the step of:

forming an insulating film on a surface of the linear body to thereby form the separation region.

The present invention (7) resides in an integrated circuit comprising:

a plurality of linear bodies, each having a cross section which has a plurality of regions for forming a circuit element formed in the linear body and which is continuously or intermittently formed in the longitudinal direction.

The present invention (8) resides in the integrated circuit of the invention (7), wherein the integrated circuit is a semiconductor memory, an image sensor, or a PLA.

The present invention (9) resides in the integrated circuit of the invention (7) or (8), wherein the linear bodies are formed of a material made of an organic semiconductor or electroconductive polymer.

The present invention (10) resides in the integrated circuit of any one of the inventions (4) and (7) through (9), wherein the linear body has a cross section in a circular, polygonal, star, crescent, petal, character shape, or another arbitrary shape.

Effect of the Invention (1) There can be avoided occurrence of latch-up, by forming a complementary MISFET by electrically separating a linear body including an N-type MISFET and a linear body including a P-type MISFET from each other.

(2) There is obtained an effect of a decreased production cost by a decreased material cost, a simplified production process, and the like, in a manner that electroconductive regions, semiconductor regions, and/or insulator regions constituting complementary MISFET's or integrated circuits are formed of an organic semiconductor or electroconductive polymer.

(3) Linear bodies can be electrically separated from one another by simple coating or vapor deposition of an insulating material, thereby enabling achievement of device separation by a simplified process.

(4) By virtue of the structure where the cross section having the plurality of regions for forming a circuit element is continuously or intermittently formed in the longitudinal direction, it is possible to produce a linear device(s) having the plurality of regions in a simple process such as by extrusion forming or extension forming.

(5) Planar integrated circuit(s) fabricated by weaving or braiding the linear bodies is/are flexible, thin in thickness, and light-weighted, and thus can be utilized as an electronic device to be used in thin equipment, portable equipment, and the like.

(6) Linear integrated circuit(s) fabricated by bundling up the linear bodies is/are flexible, thin in diameter, and light-weighted, and thus can be utilized as an electronic device to be used in linear parts or linear apparatus such as wiring cords, fiberscopes, and the like.

(7) Without limited to the linear bodies laid out in a two-dimensional plane shape, planes each including the linear bodies laid out therein may be stacked, or the linear bodies themselves may be stacked to form a three-dimensional integrated circuit(s), thereby enabling a drastically improved degree of integration.

(8) Integrated circuit(s) can be fabricated by combining the linear bodies with one another, thereby enabling production of a large-sized device by combining a large number of linear bodies, independently of a scale of production equipment. Particularly, it is also possible to drastically increase a storage capacity of a semiconductor memory.

(9) In case of production of an integrated circuit(s) by using the plurality of linear bodies, the integrated circuit(s) can be produced by inspecting the linear bodies and adopting only the non-defective ones selected before production. Alternatively, it is even possible to conduct an inspection after production of an integrated circuit(s) and replace only linear bodies at defective portions, thereby enabling improvement of a production yield in case of an upsized integrated circuit (s) without conducting a process management so strictly.

(10) In case that the linear body constituting the circuit elements is simultaneously formed with a linear photoelectric conversion device such as a light emitting device, displaying device, photocell, photosensor, and the like, the photoelectric conversion device is allowed to have an increased surface area to effectively improve a photoelectric conversion efficiency, by causing the linear device to have a cross-sectional shape which is polygonal, star-shaped, crescent-shaped, petal-shaped, character-shaped, and so on having an increased surface area.

Figure 1:
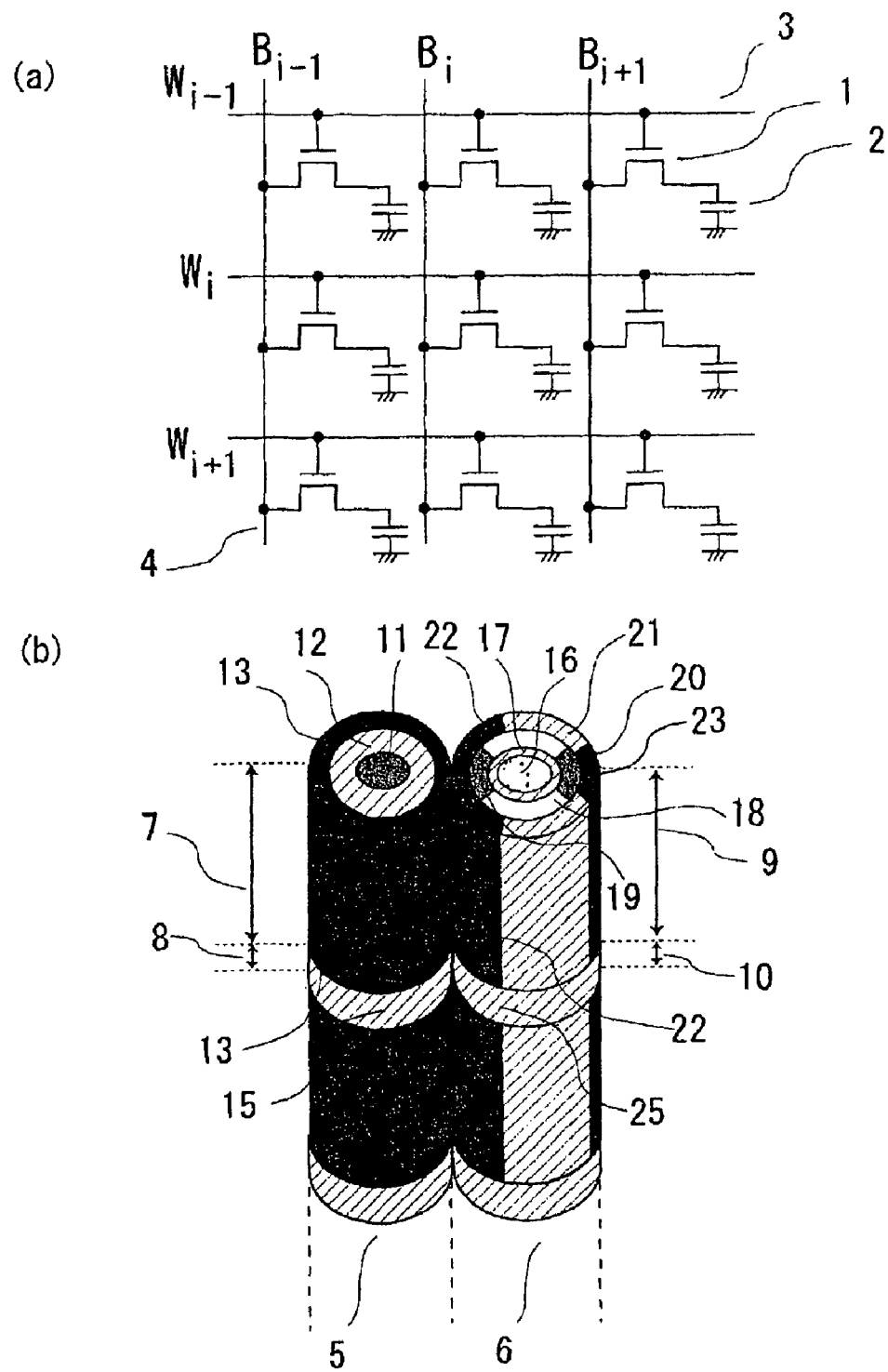
[FIG. 1] (a) is a circuit diagram of a DRAM, and (b) is a perspective view of an integrated circuit of the present invention corresponding to a memory cell of the DRAM shown in (a).

| Explanation of reference numerals | |
|---|---|
| 1, 61 | MISFET |
| 2 | capacitor |
| 3, 64, 83 | word line |
| 4, 65, 84 | bit line |
| 5 | linear capacitor |
| 6, 66, 132, 192, 251, 252, 253, 271, 272, 273, 274 | linear MISFET |
| 51, 331 | linear N-type MISFET |
| 52, 332 | linear P-type MISFET |
| 334, 335 | linear body |
| 7, 9, 111, 133, 141, 214, 307, 311, 327, 331 | device region |
| 8, 10, 112, 134, 142, 215, 313, 333 | device separation region |
| 11, 13 | electrode region |
| 12, 15, 21, 25, 31, 32, 33, 39, 44, 110, 113, 138, 139, 140, 151, 152, 153, 209, 210, 211, 301, 321, 312, 332, 317, 318 | insulator region |
| 16, 34, 43, 55, 58, 143, 201, 302, 322, 316 | gate electrode |
| 17, 35, 42, 144, 202, 303, 323 | gate insulator region |
| 18, 37, 40, 105, 147, 205, 306, 326 | semiconductor region |
| 19, 36, 41, 106, 145, 203, 304, 324 | source region |
| 20, 38, 39, 107, 146, 204, 305, 325 | drain region |
| 22, 53, 56, 67, 86, 108, 149, 207, 254, 275, 308, 314 | source electrode |
| 23, 54, 57, 109, 150, 208, 211, 212, 213, 255, 276, 315 | drain electrode |
| 81 | memory element |
| 62, 82 | connected node |
| 63 | unconnected node |
| 85 | linear memory device |
| 68, 87 | contact layer |
| 69, 88 | wiring layer |
| 101 | control gate electrode |
| 102 | first gate insulator region |
| 103 | floating gate electrode |
| 104 | second gate insulator region |
| 121 | vertical scanning circuit |
| 122 | horizontal scanning circuit |
| 123 | photodiode |
| 124 | vertical switch MISFET |
| 125 | vertical selection line |
| 126, 193 | vertical signal line |
| 127 | horizontal switch MISFET |
| 128 | output amplifier |
| 129 | output line |
| 131, 191 | linear photodiode |
| 135 | anode region |
| 136 | cathode region |
| 137 | cathode electrode |
| 256, 257 | AND plane input wiring |
| 258 | AND plane output wiring |
| 259, 279 | ground wiring |
| 277 | OR plane input wiring |
| 278 | OR plane output wiring |
| 260, 280 | source contact |
| 194, 261, 281 | drain contact |
| 341 | extrusion apparatus |
| 342 | starting material 1 reservoir |
| 343 | starting material 2 reservoir |
| 344 | starting material 3 reservoir |
| 345, 350 | die |
| 346 | linear device |
| 347 | roller |
| 348 | doping treatment part |
| 349 | electrode formation treatment part |
| 361 | substrate |
| 362 | photoreactive organic film |
| 363 | linear device |
| 364 | mask |
| 365 | insulator region |
| 366 | electric conductor region |
| 401, 451, 491 | planar substrate |
| 402, 452 | device separation region |
| 403, 421, 431, 456, 468, 474 | gate electrode |
| 404, 455 | gate insulating film |
| 479 | gate wiring |
| 405, 422, 432, 453, 475 | source region |
| 406, 423, 433, 454, 476 | drain region |
| 407, 457 | source electrode |
| 408, 458 | drain electrode |
| 424, 434, 477 | source contact |
| 425, 435, 478 | drain contact |
| 426, 436, 480 | source wiring |
| 427, 437, 469, 481 | drain wiring |
| 459 | cathode region |
| 460 | cathode electrode |
| 409, 461 | inter-layer insulating film |
| 410, 467 | MISFET |
| 462 | photodiode |
| 463 | vertical switch MISFET |
| 464 | vertical selection line |
| 465 | vertical signal line |
| 411 | word line |
| 412 | bit line |
| 413 | connected node |
| 414 | unconnected node |
| 471 | AND plane input wiring |
| 473 | AND plane output wiring |
| 491 | P-type substrate |
| 492, 503 | N-type well region |
| 502 | P-type well region |
| 493, 505 | N-type well contact region |

-continued

Explanation of reference numerals

| 494, 506 | P-type source region |
| 495, 507 | P-type drain region |
| 496, 508 | N-type drain region |
| 497, 509 | N-type source region |
| 498, 510 | P-type substrate contact region |
| 499, 500, 511, 512 | gate electrode |
| 501 | insulative substrate |

MODE FOR CARRYING OUT THE INVENTION

There will be clarified definitions of terms in the present invention, together with explanation of the best mode of the present invention. Further, the technical scope of the present invention is not limited at all by the best mode (structure, shape, material, and the like) to be described hereinafter.

(Definitions of Terms)

"Linear Body" and "Linear Device":

"Linear body" refers to a solid substance in an elongated thread or fiber shape, and in the present invention, circuit elements such as transistor, capacitor, resistor or the like are formed in a linear body to thereby fabricate a complementary MISFET, integrated circuit, and the like. Circuit elements formed in a linear body are each called "linear device". Alternating arrangement of device regions and separation regions enables formation of a plurality of circuit elements in a single "linear body".

"Device Region" and "Separation Region":

"Device region" refers to a region for constituting a circuit element, such as a gate electrode, gate insulating film, source, drain, and semiconductor region in a MISFET, for example. Particularly, "semiconductor region" in an explanation of a MISFET does not embrace all regions made of semiconductor materials, and shall refer to a continuous semiconductor region including a region interposed between a source and a drain to form a channel by control of a gate voltage.

Further, "separation region" refers to a region electrically separating a circuit element from another circuit element.

"Organic Semiconductor" and "Electroconductive Polymer":

Substances are classified into "organic substances" and "inorganic substances" depending on whether or not complicated carbon compounds are included, and classified into "electric conductors", "semiconductors", and "insulators" depending on electrical conductivities, respectively. Further, substances are classified into "high-molecular ones" and "low-molecular ones" depending on values of molecular weights.

"Organic semiconductor" refers to a semiconductor made of an organic substance, and similarly to an inorganic semiconductor, exhibits electroconductivity based on positive holes as carriers in case of a P-type semiconductor and exhibits electroconductivity based on electrons as carriers in case of an N-type semiconductor, by doping of impurities. Also embraced in organic semiconductors are substances having lower molecular weights.

"Electroconductive polymer" refers to a substance having a larger molecular weight which is a material typically exhibiting a higher electroconductivity by doping. Also embraced in electroconductive polymers are inorganic substances without including complicated carbon compounds.

"Comprising" means a concept of "comprising only" and a concept of "including". Thus, the integrated circuit according to the present invention (4) may include a circuit element other than a complementary MISFET, for example.

(Complementary MISFET)

(Linear Device)

Figure 16:
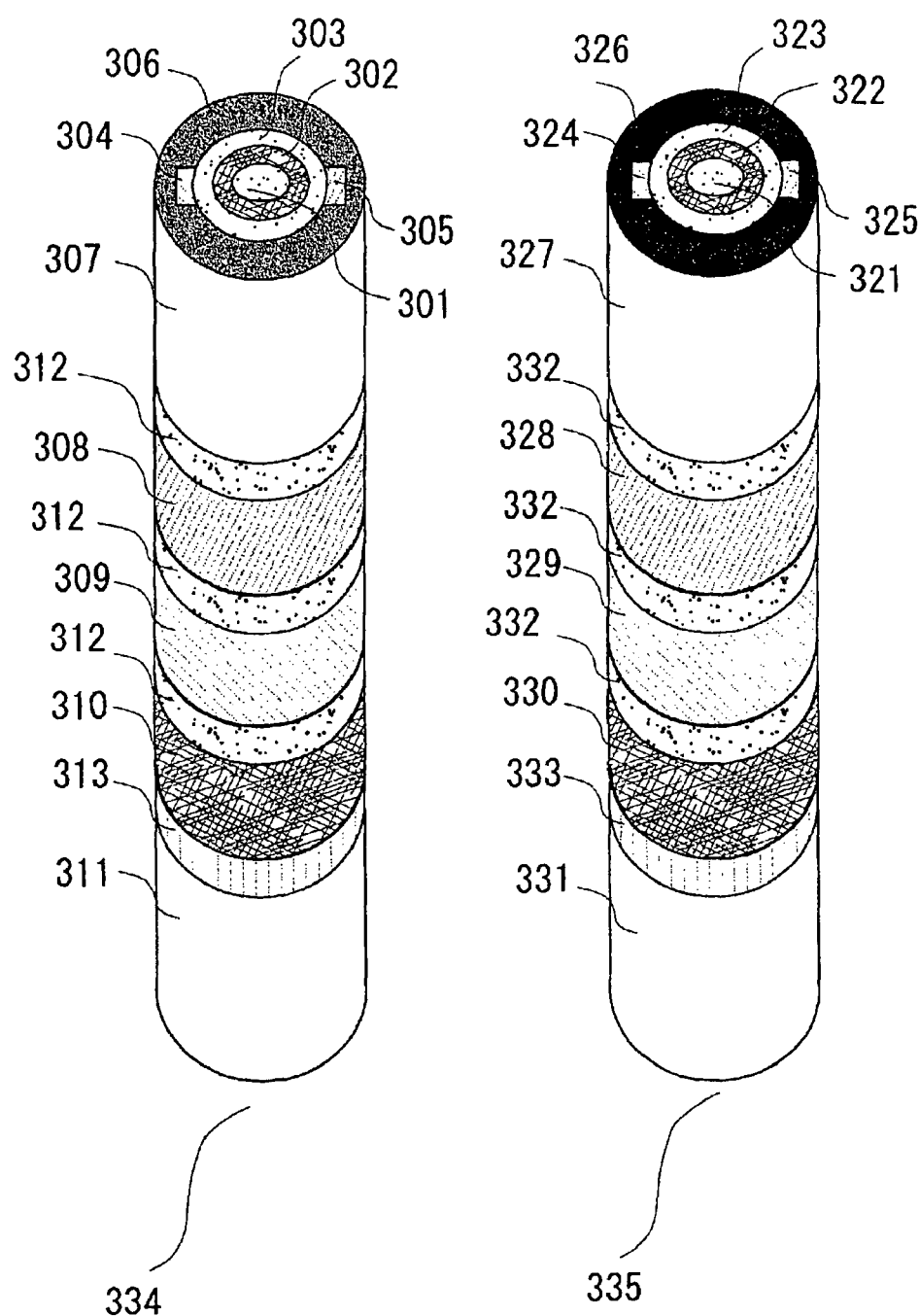
[FIG. 16] A perspective view of linear devices constituting a complementary MISFET of the present invention.

FIG. 16 is a perspective view of an N-type MISFET and a P-type MISFET constituting a complementary MISFET of the present invention. Linear body 334 and linear body 335 constituting the complementary MISFET of the present invention are formed as independent linear bodies, respectively, and the linear body 334 is formed with a plurality of N-type MISFET's and the linear body 335 is formed with a plurality of P-type MISFET's. The N-type MISFET 307 formed in the linear body 334 is constituted of an insulator region 301, a gate electrode 302, a gate insulator region 303, a source region 304, a semiconductor region 306, and a drain region 305; and the P-type MISFET 332 formed in the linear body 335 is constituted of an insulator region 321, a gate electrode 322, a gate insulator region 323, a source region 324, a semiconductor region 326, and a drain region 325.

In either of the N-type MISFET and P-type MISFET, the linear body functions as a MISFET even when an electric conductor region or hollow region is adopted as a center region of the linear body instead of adopting an insulator region as the center region of the linear body.

In the N-type MISFET 307, application of a voltage higher than a threshold voltage of the gate electrode 302 to the semiconductor region 306 increases an electron density at a surface of the semiconductor region 306 contacting with the gate insulator region 303 to thereby form a channel, so that the source region 304 and drain region 305 as N-type regions are conducted to each other. It is desirable to control the potential of the semiconductor region 306, by applying an external voltage. Further, it is desirable to equalize the potential of the semiconductor region 306 to that of the source region.

In the P-type MISFET 327, application of a voltage lower than a threshold voltage of the gate electrode 322 to the semiconductor region 326 increases a positive hole density at a surface of the semiconductor region 326 contacting with the gate insulator region 323 to thereby form a channel, so that the source region 324 and drain region 325 as P-type regions are conducted to each other. It is desirable to control the potential of the semiconductor region 326, by applying an external voltage. Further, it is desirable to equalize the potential of the semiconductor region 326 to that of the source region.

There will be explained electrode structures and cross-sectional structures of the MISFET's formed in the linear bodies, respectively, with reference to FIG. 16 and FIG. 17(a) through (f). As shown in FIG. 16, the source region 304, drain region 305, and gate electrode 302 of the MISFET 307 in the linear body 334 are electrically connected to a source electrode region 308, a drain electrode region 309, and a gate electrode region 310 at a surface of the linear body 334, respectively. Electrode separation regions 312 are those for electrically separating the source electrode region 308, drain electrode region 309, and gate electrode region 310, from one another. The N-type MISFET 307 is electrically separated from an N-type MISFET 311 by a MISFET separation region 313.

In turn, the source region 324, drain region 325, and gate electrode 322 of the MISFET 327 in the linear body 335 are electrically connected to a source electrode region 328, a drain electrode region 329, and a gate electrode region 330 at a surface of the linear body, respectively. Electrode separation regions 332 are those for electrically separating the source electrode region 328, drain electrode region 329, and gate electrode region 330, from one another. The P-type MISFET 327 is electrically separated from a P-type MISFET 331, by a MISFET separation region 333.

Figure 17:
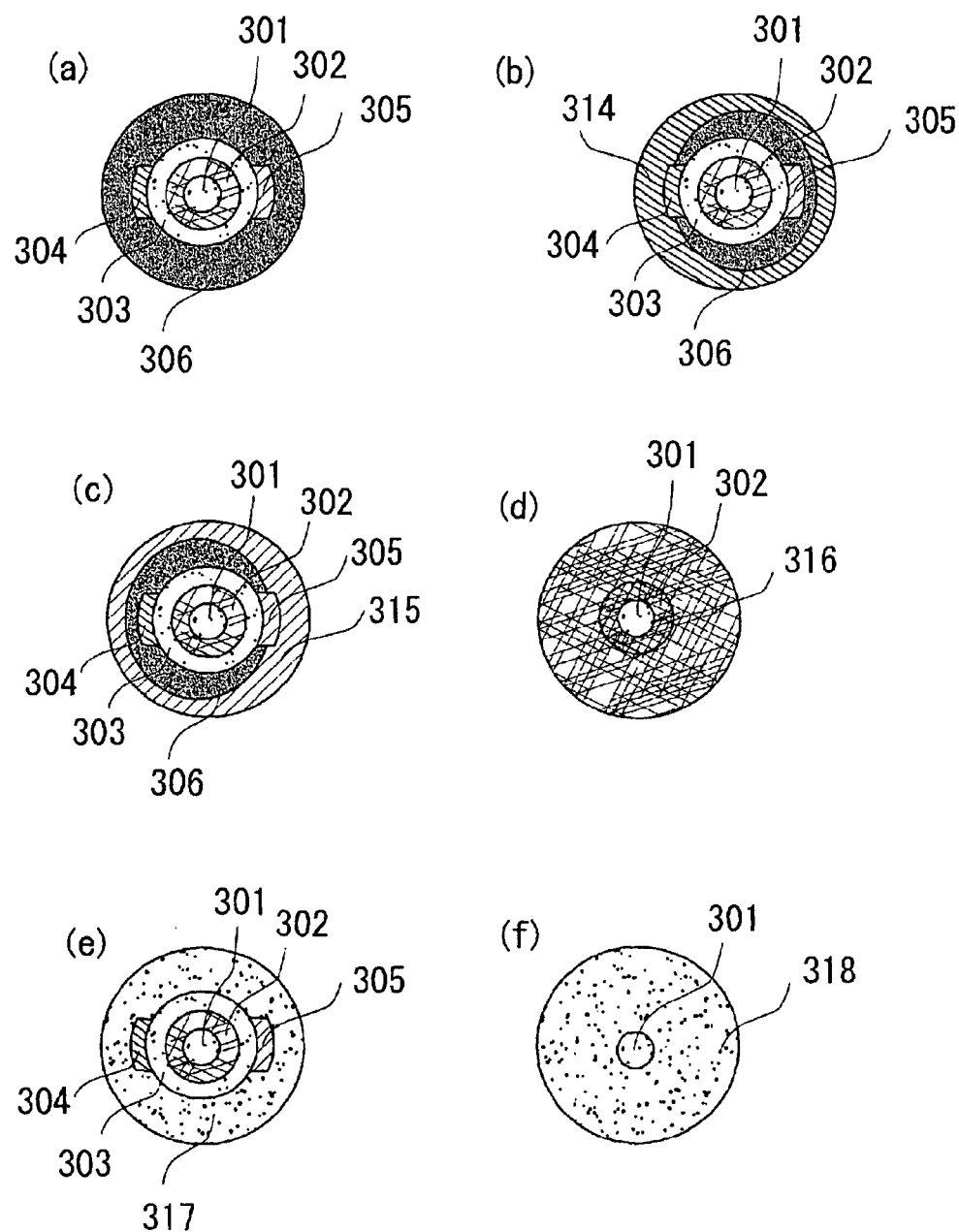
[FIG. 17] (a) through (f) are cross-sectional views of the linear device constituting the complementary MISFET of the present invention, respectively.
Figure 18:
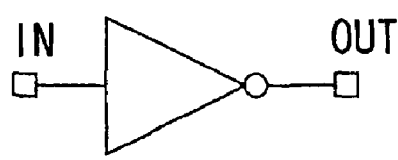
[FIG. 18] (a) through (c) are views for explaining an inverter constituted of the complementary MISFET of the present invention, respectively.
Figure 18:
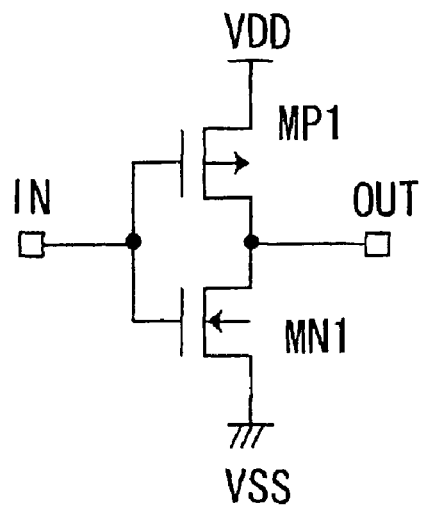
Figure 18:
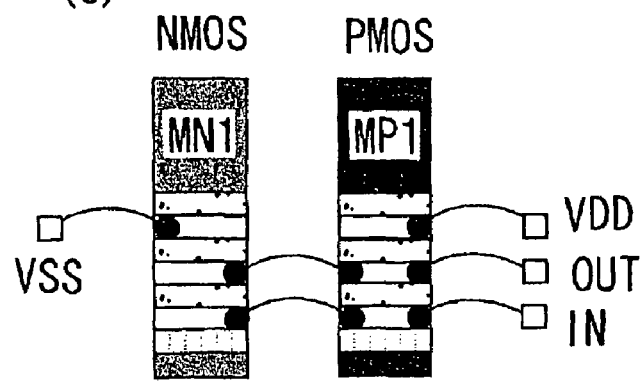
Figure 19:
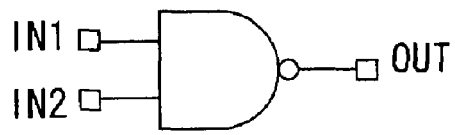
[FIG. 19] (a) through (c) are views for explaining a NAND constituted of the complementary MISFET's of the present invention, respectively.
Figure 19:
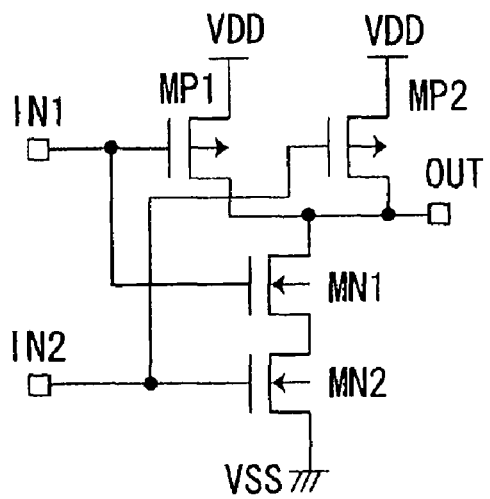
Figure 19:
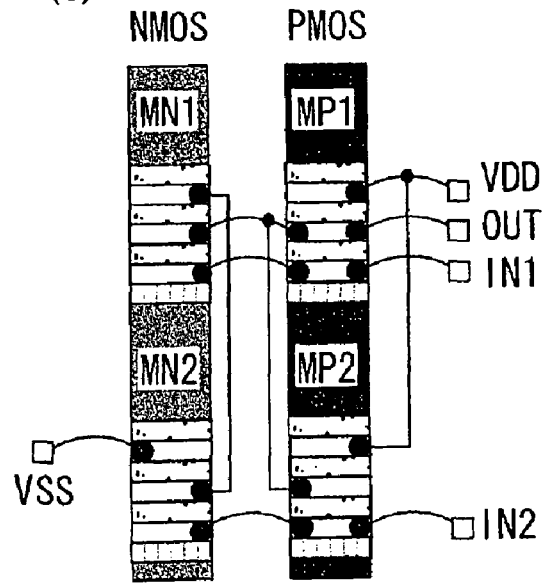
Figure 20:
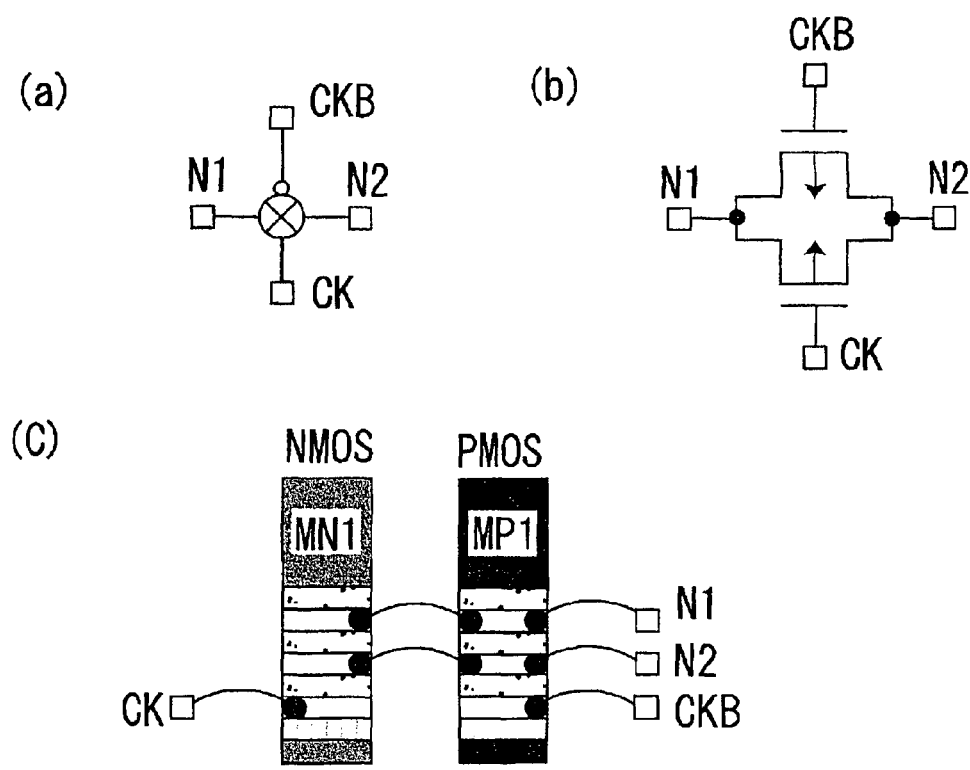
[FIG. 20] (a) through (c) are views for explaining an inverter transfer gate constituted of the complementary MISFET of the present invention, respectively.
Figure 21:
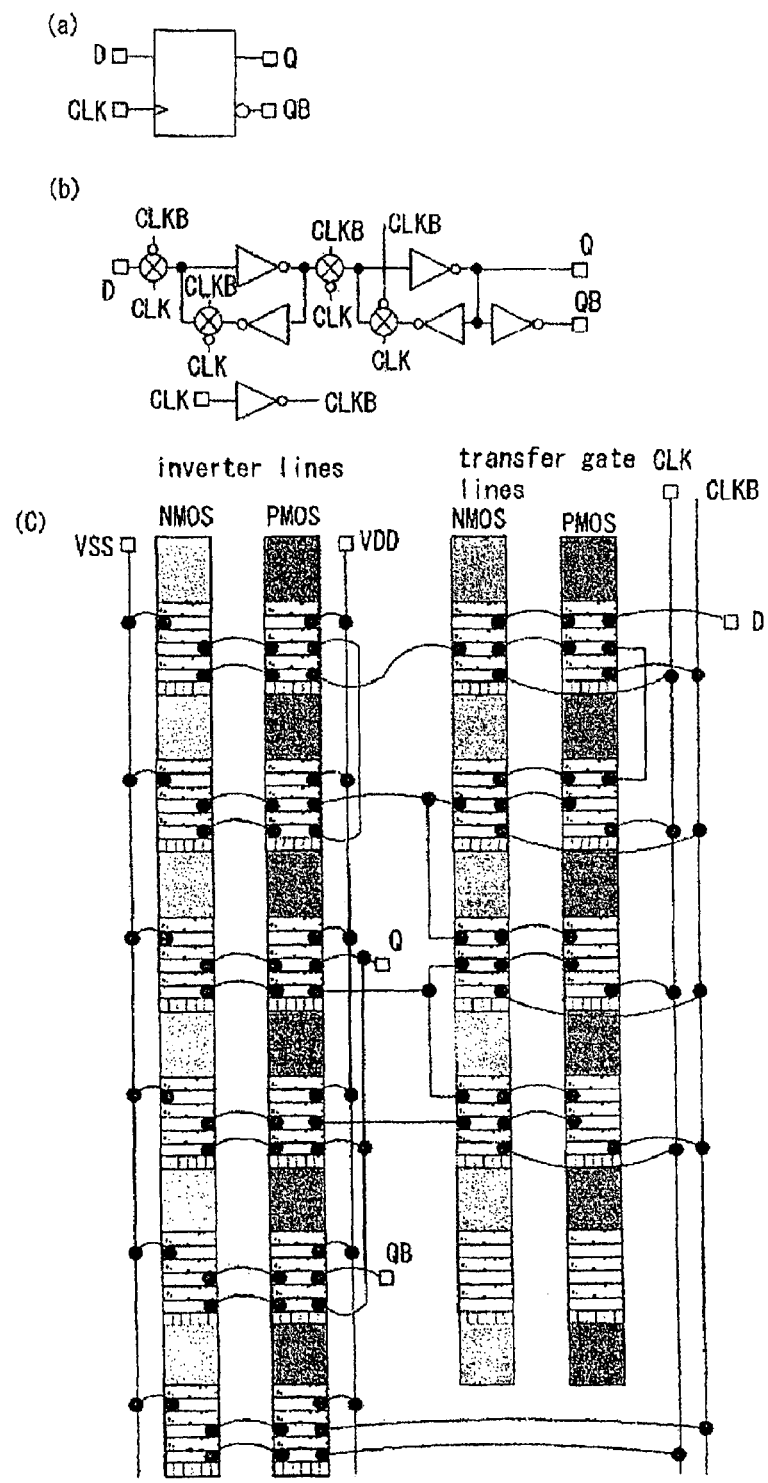
[FIG. 21] (a) through (c) are views for explaining a DFF constituted of the complementary MISFET's of the present invention, respectively.

Although cross-sectional structures will be explained hereinafter with respect to the N-type MISFET, the same structures shall be adopted for the P-type MISFET. FIG. 17(a) is a cross-sectional view of the linear body at the MISFET region 307. Arranged around the insulator region 301 at the center are the gate electrode 302, gate insulator region 303, source region 304, drain region 305, and semiconductor region 306. FIG. 17(b) is a cross-sectional view of the linear body at the source electrode region 308. After forming the linear body in the cross-sectional view of FIG. 17(a), there is removed a surface of the semiconductor region 306 by a method such as etching or grinding in a manner to expose the source region 304, and a source electrode region 314 is formed therearound such as by coating of an electric conductor region. FIG. 17(c) is a cross-sectional view of the linear body at the drain electrode region 309. After forming the linear body in the cross-sectional view of FIG. 17(a), there is removed a surface of the semiconductor region 306 by a method such as etching or grinding in a manner to expose the drain region 305, and a drain electrode region 315 is formed therearound such as by coating of an electric conductor region. FIG. 17(d) is a cross-sectional view of the linear body at the gate electrode region 310. After forming the linear body in the cross-sectional view of FIG. 17(a), the semiconductor region 306, source region 304, drain region 305, and gate insulator region 303 are removed by a method such as etching or grinding, and a gate electrode region 316 is formed therearound such as by coating of an electric conductor region. FIG. 17(e) is a cross-sectional view of the linear body at the electrode separation region 312. After forming the linear body in the cross-sectional view of FIG. 17(a), the semiconductor region 306 is removed by a method such as etching or grinding, and an insulative separation region 317 is formed therearound such as by coating of an insulator region. FIG. 17(f) is a cross-sectional view of the linear body at the MISFET separation region 313. After forming the linear body in the cross-sectional view of FIG. 17(a), the semiconductor region 306, source region 304, drain region 305, gate insulator region 303, and gate electrode 302 are removed by a method such as etching or grinding, and an insulative separation region 318 is formed therearound such as by coating of an insulator region.

(Logic Circuit Cell)

FIG. 18 through FIG. 21 are views for explaining embodiments where logic circuit cells are fabricated by the complementary MISFET's of the present invention, respectively.

FIGS. 18(a) and (b) are a symbol and a circuit diagram of an inverter, respectively. FIG. 18(c) is a front view of an inverter constituted of a complementary MISFET of the present invention.

FIGS. 19(a) and (b) are a symbol and a circuit diagram of a NAND, respectively. FIG. 19(c) is a front view of a NAND constituted of complementary MISFET's of the present invention.

FIGS. 20(a) and (b) are a symbol and a circuit diagram of a transfer gate, respectively. FIG. 20(c) is a front view of a transfer gate constituted of a complementary MISFET of the present invention.

FIGS. 21(a) and (b) are a symbol and a circuit diagram of a DFF, respectively. FIG. 21(c) is a front view of a DFF constituted of complementary MISFET's of the present invention.

Although the examples of fabrication of inverter, NAND, transfer gate, and DFF have been explained as embodiments for fabricating logic circuit cells by using the complementary MISFET's of the present invention, it is also possible to fabricate other logic circuit cells such as NOR, NAND, OR, EXOR, EXNOR, MUX, TFF, JKFF, and the like, by using the complementary MISFET's of the present invention.

Further, it is possible to bundle up linear bodies to thereby fabricate a linear logic circuit cell, or to arrange linear bodies on a planar substrate to thereby fabricate a planar logic circuit cell.

Unlike a case of formation of a conventional complementary MISFET on a planar substrate, it is possible upon production of a complementary MISFET of the present invention to attain insulative separation of an N-type MISFET and a P-type MISFET from each other by a relatively simple process such as formation of an insulating film on a surface of a linear body, filling of an insulating material into between separated linear bodies, or the like thereby eliminating the necessity of expensive materials.

For example, it is possible to form an insulating film on a surface of a linear body, by a method to immerse a linear body into a solution containing an insulating material to thereby adhere the solution onto a surface of the linear body followed by subsequent drying, or a method to coat or vapor deposit an insulating material onto a linear body.

Further, it is possible to separatingly arrange a plurality of linear bodies, and fill an insulating material therebetween from the above by a coating method such as a spin coat method or by vapor deposition. It is also possible to support linear bodies by an insulative support body, to thereby separate the linear bodies from each other by a space, or fill an insulating material into a part of the space.

The complementary MISFET's of the present invention are capable of producing an insulative separation structure by inexpensive materials and by a relatively simple process without formation of parasitic thyristors, thereby enabling avoidance of occurrence of latch-up.

Since the complementary MISFET's of the present invention include multiple MISFET's or logic circuit cells formed in a linear body, it is easy to form the same sizes of MISFET's or to form logic circuit cells having a common circuit constant in each linear body, thereby suiting to production of an integrated circuit including circuit elements or circuit cells arranged in an array.

It is also possible to use the complementary MISFET's of the present invention to fabricate: a gate array where a plurality of kinds of logic circuit cells are previously formed, and there is fabricated an integrated circuit required by a user only by modification of wiring masks; and an integrated circuit called an FPGA (Field Programmable Gate Array) where there is conducted a program to a programmable memory to thereby change over connections among cells by data to be written into the memory, thereby fabricating an integrated circuit required by a user.

(Integrated Circuit)

There will be explained an integrated circuit of the present invention, with reference to concrete examples of a semiconductor memory, image sensor, and PLA.

(Semiconductor Memory)

For semiconductor memory, there will be sequentially explained concrete examples of a DRAM, SRAM, masked ROM, and E²PROM.

(DRAM)

FIG. 1(a) is a circuit diagram of a DRAM. The DRAM is constituted of capacitors 2 for accumulating electric charges therein, switching MISFET's 1 for selecting the capacitors, respectively, word lines 3 for controlling the switching MISFET's, respectively, and bit lines 4 for achieving reading and writing of data. Electronic information is recorded depending on whether an electric charge is accumulated in each capacitor 2. For example, in achievement of writing into a capacitor corresponding to a word line Wi and a bit line Bi, the word line Wi is made High to thereby turn ON the associated MISFET and the bit line Bi is made High to thereby conduct a current through the capacitor, thereby accumulating electric charge therein. Alternatively, the bit line Bi is made Low to flow a current from the capacitor, thereby enabling an electric charge to be extracted therefrom. Further, upon reading a data from the capacitor corresponding to the word line Wi and bit line Bi, the word line Wi is made High to turn ON the associated MISFET, and a voltage of the bit line Bi is sensed by a sense amplifier (not shown).

The DRAM shown in FIG. 1(a) has been explained for a case that the MISFET's constituting the transistor array are all N-type MISFET's. However, even in a case where a transistor array is constituted of P-type MISFET's, it is easy to realize a DRAM comprising the P-type MISFET's by modifying a logic, such as making each word line to be Low to thereby turn ON an applicable switching MISFET. This is also applicable to a masked ROM or $E^2$PROM to be described later, and it is thus possible to realize the semiconductor memory of the present invention even by using MISFET's utilizing an organic semiconductor where positive holes have larger mobilities than electrons depending on the type of the semiconductor material, for example.

Further, although the DRAM, and an SRAM, masked ROM, and $E^2$PROM to be described later include peripheral circuits such as a sense amplifier, it is also possible to form such peripheral circuits by the linear devices.

(Linear Device for constituting Semiconductor Memory)

FIG. 1(b) is a perspective view of an integrated circuit of the present invention corresponding to the memory cell of the DRAM shown in FIG. 1(a). Shown in FIG. 1(b) is a portion where two memory cells each comprising a linear MISFET 6 and a linear capacitor 5 are arranged in the longitudinal direction of linear bodies.

Figure 2:
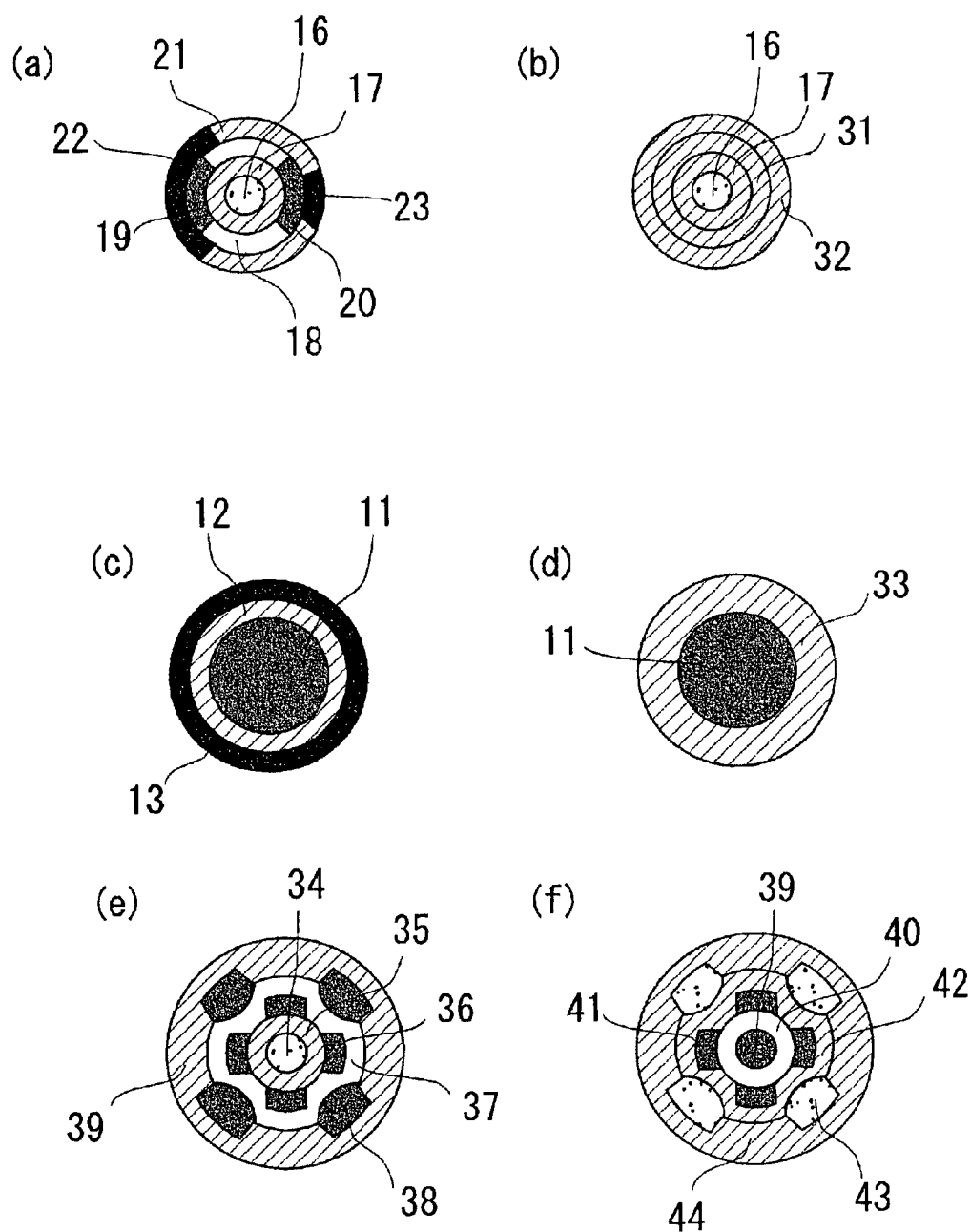
[FIG. 2] (a) through (d) are cross-sectional views of a linear device constituting the integrated circuit of the present invention the perspective view of which is shown in FIG. 1(b), respectively. (e) and (f) are cross-sectional views of other linear devices, respectively.

FIGS. 2(a) through (d) are cross-sectional views of the linear device the perspective view of which is shown in FIG. 1(b). FIG. 2(a) is a cross-sectional view of the linear MISFET at a device region 18, and FIG. 2(b) is a cross-sectional view at an insulative separation region 10. Further, FIG. 2(c) is a cross-sectional view of the linear capacitor at a device region 7, and FIG. 2(d) is a cross-sectional view at an insulative separation region 8.

As shown in FIG. 2(a), the device region of the MISFET has a gate electrode 16 at the center, and is formed outwardly thereof with a gate insulator region 17, a source region 19, a drain region 20, and semiconductor regions 18. Additionally formed outside thereof are a source electrode 22, a drain electrode 23, and insulator regions 21. The source electrode 22 is formed circumferentially wider than the source region 19 and thus contacted with not only the source region 19 but also the semiconductor regions 18, and therefore, this enables the source electrode 22 to be electrically connected to the source region 19 and semiconductor regions 18 to thereby equalize the potential of the semiconductor regions 18 to that of the source electrode 22. Meanwhile, the drain electrode 23 is formed circumferentially narrower than the drain region 20, thereby preventing a short circuit between the drain electrode 23 and semiconductor regions 18.

As shown in FIG. 2(b), in the insulative separation region of the MISFET, the insulator regions 17, 31, and 32 are formed around the gate electrode 16, thereby electrically separating the source region, drain region, and semiconductor regions of the MISFET from those of an adjacent MISFET, respectively.

As shown in FIG. 2(c), the device region of the capacitor has a first electrode 11 at a center, and is sequentially formed outwardly thereof with an insulator region 12 for accumulating an electric charge therein, and a second electrode 13.

As shown in FIG. 2(d), the insulative separation region of the capacitor is formed with an insulator region 33 around the first electrode 11, thereby electrically separating the second electrode of the capacitor from that of an adjacent capacitor.

Although the source region 19, source electrode 22, drain region 20, drain electrode 23, and semiconductor regions 18 are electrically separated from a circuit region of the adjacent MISFET, the gate electrode 16 is continuous through a plurality of MISFET's constituting the linear MISFET's 6. This allows for the word lines shown in FIG. 1(a) to be readily formed.

Although the second electrode 13 in the linear capacitor is electrically separated from a second electrode of the adjacent capacitor by the insulator region 15, the first electrode 11 is continuous through a plurality of capacitors constituting the linear capacitors. This allows for the wiring shown in FIG. 1(a) from the capacitor to a ground potential to be readily formed.

It is also possible to form an integrated circuit by using not only the MISFET of the structure shown in FIG. 2(a) but also a MISFET of another structure. FIG. 2(e) shows a linear MISFET which includes a gate electrode 34 arranged at a center of a cross-section of the linear device, and is sequentially formed outwardly thereof with a gate insulator region 35, source regions 36, a semiconductor region 37, drain regions 38, and an insulator region 39. Similarly, FIG. 2(f) shows a linear MISFET which includes a drain region 39 arranged at a center of a cross-section of the linear device, and is sequentially formed outwardly thereof with a semiconductor region 40, source regions 41, a gate insulator region 42, gate electrode regions 43, and an insulator region 44. In the linear MISFET's shown in FIG. 2(e) and FIG. 2(f), the source regions have opening portions and the drain region(s) is/are formed to be contacted with the semiconductor region(s) on the opening portions, respectively. This enables a channel length to be controlled by a thickness of each semiconductor region. Thus, downsizing of a channel length is facilitated to enable a downsized and accelerated image sensor.

Further, also such a linear device of a structure where the source regions and drain region(s) are exchanged with drain regions and source region(s) in FIG. 2(e) and FIG. 2(f), normally operates as MISFET's, thereby enabling constitution of a semiconductor memory of the present invention. The MISFET's of the structures shown in FIG. 2(e) and FIG. 2(f) are usable as MISFET's constituting not only a semiconductor memory but also an image sensor, PLA or logic circuit cell.

(SRAM)

Figure 3:
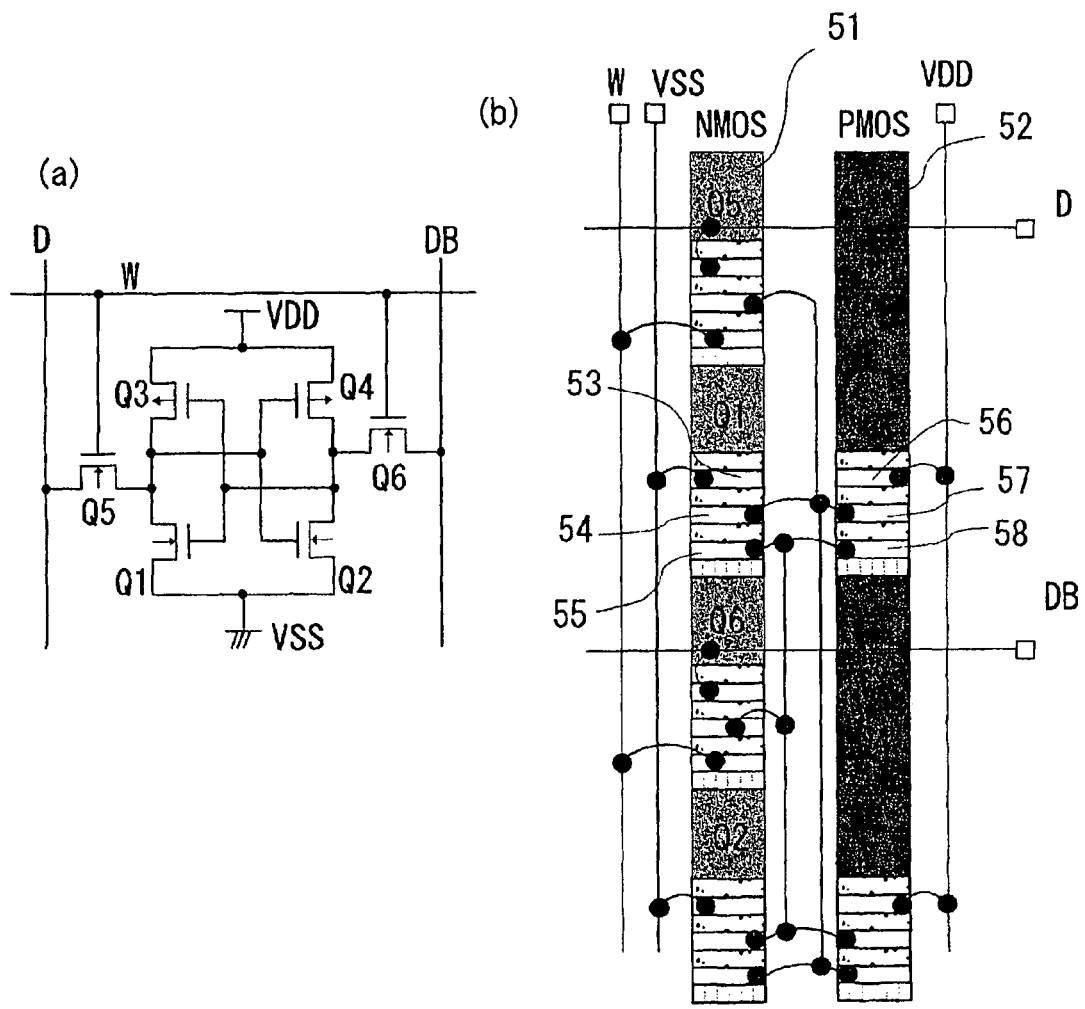
[FIG. 3] (a) is a circuit diagram of an SRAM, and (b) is a front view of an integrated circuit corresponding to the SRAM shown in (a).

FIG. 3(a) is a circuit diagram of an SRAM. The SRAM is configured to accumulate an electric charge in a flip-flop comprising P-type MISFET's Q3 and Q4 and N-type MISFET's Q1 and Q2, thereby recording electronic information. Selection of a memory cell is achieved by N-type MISFET's Q5 and Q6. In achievement of writing into the memory cell, a word line W is made High to turn ON the Q5 and Q6, and in this state, potentials of bit lines D and DB are controlled. For example, when the bit line D is made High, the bit line DB is made Low which is a reversed signal thereof. The word line W is made Low to thereby turn OFF the Q5 and Q6, thereby storing an electric charge inputted at the time of writing. In turn, in achievement of reading, the Q5 and Q6 are turned ON, to thereby detect a voltage of the bit line by a sense amplifier (not shown). Although the SRAM has a larger number of devices constituting the memory cell than a DRAM, the former has a feature of lower power consumption where data is not lost even without refreshing.

FIG. 3(b) shows a front view of an integrated circuit of the present invention corresponding to the SRAM shown in FIG. 3(a). While the SRAM is constituted of the complementary MISFET's, the SRAM comprising linear MISFET's of the present invention is constituted of independent linear N-type MISFET's 51 and linear P-type MISFET's 52. The linear MISFET's shown in FIG. 3(b) comprise a plurality of MISFET's intermittently formed in a single linear body, in a manner that the MISFET's each have electrode regions adjacent to a device region and are each electrically separated from an adjacent MISFET by an insulative separation region. As electrode regions, the Q1 as an N-type MISFET has a source electrode 53, a drain electrode 54, and a gate electrode 55, for example. Further, the Q3 as a P-type MISFET has a source electrode 56, a drain electrode 57, and a gate electrode 58. Although wirings designated by VSS, VDD, W, D, and DB, and contacts for connecting electrodes of the MISFET's to one another are shown to be connected to one another by black dots and lines as expediency in FIG. 3(b), connections in an actual semiconductor memory are achieved by electrical connections by electroconductive materials made of a photoreactive organic material or the like, by using a wiring formation method to be described later herein.

(Masked ROM)

Figure 4:
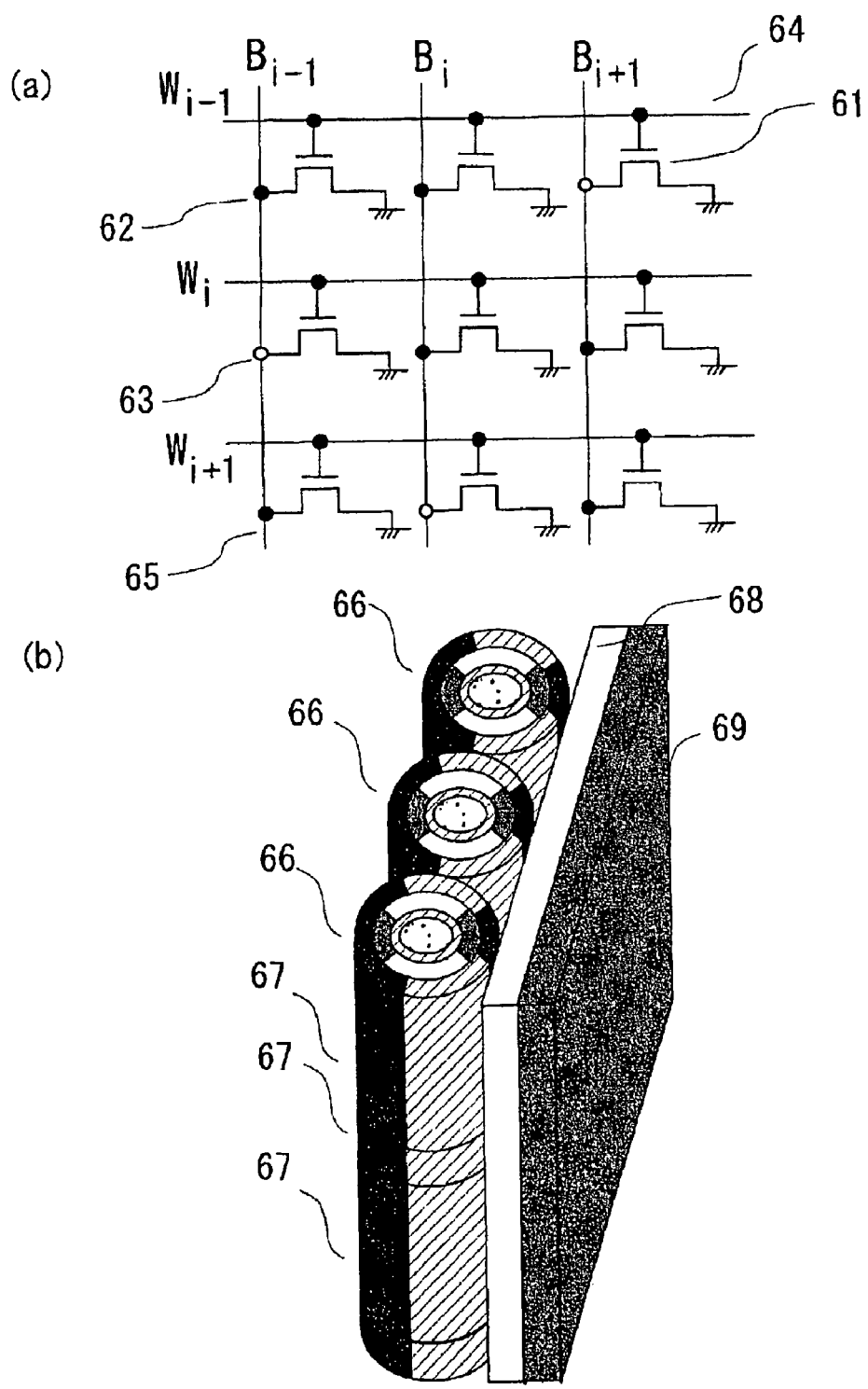
[FIG. 4] (a) is a circuit diagram of a masked ROM, and (b) is a perspective view of an integrated circuit of the present invention corresponding to the masked ROM shown in (a).

FIG. 4(a) is a circuit diagram of a masked ROM. Memory cells are each constituted of one MISFET 61 having a source connected to a ground potential, and the MISFET has a gate connected to an associated word line 64 for selecting the memory cell. Concerning drains of the MISFET's, there are selectively formed connected nodes 62 and unconnected nodes 63 to bit lines for achieving reading of data. For example, supposing that there is sensed a voltage of a bit line by connecting the bit line to a power supply potential through a load, although the bit line of a memory cell having a connected node 62 is made Low when the associated MISFET is turned ON because a current flows to the ground then, a memory cell having an unconnected node is made High even when the associated MISFET is turned ON because a current does not flow to the ground then. Thus, formation of connected nodes and unconnected nodes of memory cells allows electronic information to be recorded.

FIG. 4(b) is a perspective view of a semiconductor memory of the present invention corresponding to the masked ROM shown in FIG. 4(a). In FIG. 4(b), linear bodies 66 are each intermittently formed with a plurality of MISFET's in the longitudinal direction of the associated linear body. In the configuration shown in FIG. 4(b), the plurality of MISFET's formed in each linear body have a mutually common source electrode and a mutually common gate electrode.

Each linear MISFET has the associated source electrode 67 connected to a ground potential. Further, the gate electrode of each linear MISFET corresponds to the applicable word line shown in FIG. 4(a). Each linear body 66 is arranged on a contact layer 68 such that a drain electrode side is contacted with the contact layer 68. Arranged adjacently to the contact layer is a wiring layer 69. Although not shown, the contact layer 68 and wiring layer 69 are formed thereon with a contact pattern and a wiring pattern to be formed by a wiring formation method to be described later, respectively, to thereby realize the electrical connection among the MISFET's in the circuit diagram shown in FIG. 4(a). Although the linear bodies 66 and contact layer 68 are directly connected to each other therebetween in FIG. 4(b), it is also possible to interpose therebetween a support substrate for the linear bodies to thereby enable the wiring layer 69 or contact layer 69 to be exchanged without changing the arrangement of the linear MISFET's. This enables different patterns of contact layers or wiring layers to be previously prepared and exchanged as required, thereby allowing the masked ROM to be used as a rewritable one. Further, it is also possible to rewrite data by combination with linear fuse elements in a manner to cut the fuse by means of electric current or laser light.

Circuit configurations of ROM's include a NAND type ROM including series-connected memory cells, and a NOR type ROM including parallel-connected memory cells. Although the masked ROM shown in FIG. 4(a) and an $E^2PROM$ to be described later and shown in FIG. 5(a) are described with respect to a circuit configuration of a NOR type ROM, it is apparent that the effect of the present invention can be obtained in the same manner as the NOR type ROM even in adoption of a circuit configuration of a NAND type ROM by using the linear MISFET's as MISFET's for constituting the ROM.

($E^2PROM$)

Figure 5:
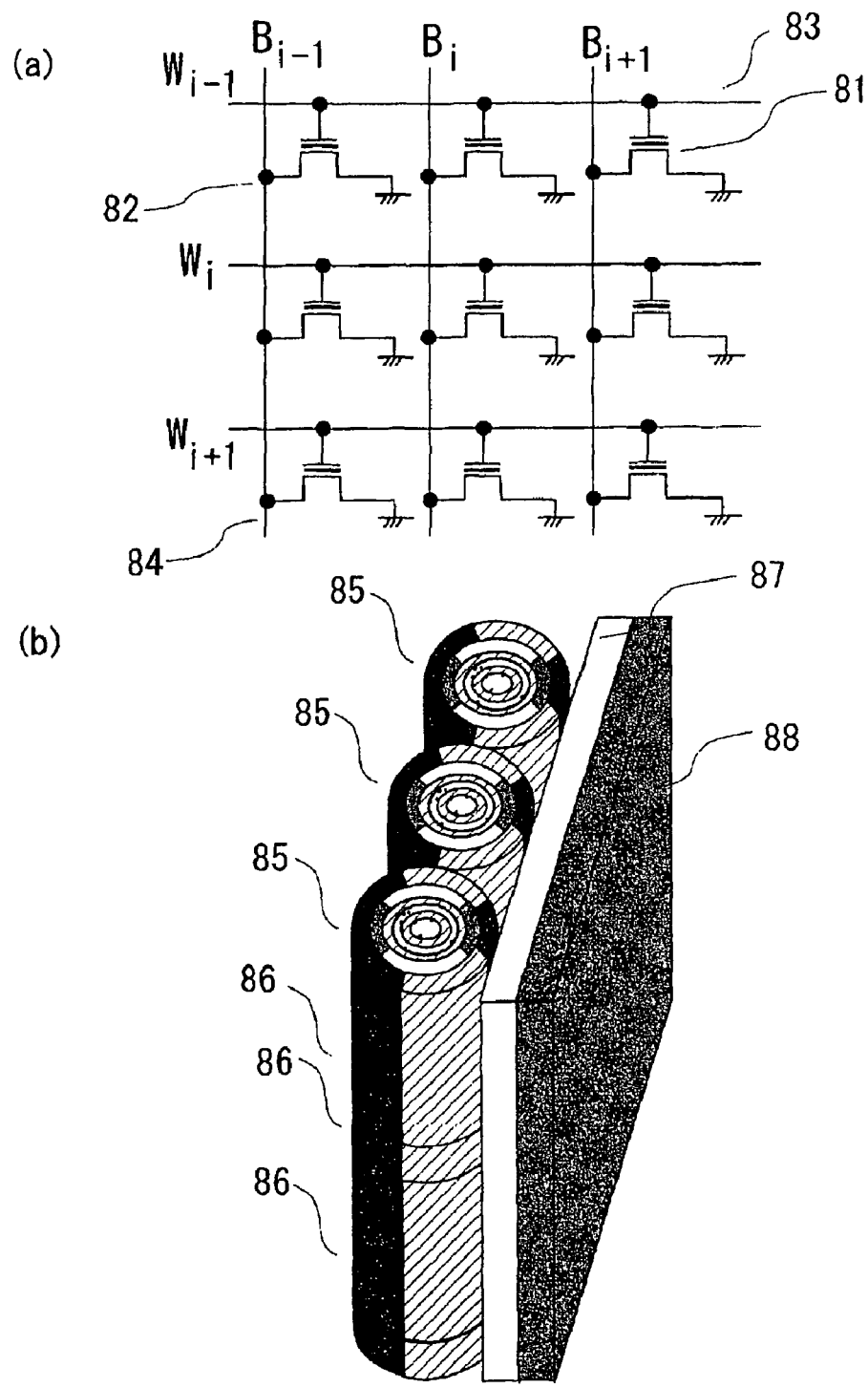
[FIG. 5] (a) is a circuit diagram of an $E^2$PROM, and (b) is a perspective view of an integrated circuit of the present invention corresponding to the $E^2$PROM shown in (a).

FIG. 5(a) is a circuit diagram of an $E^2PROM$. Each memory cell is constituted of one memory cell 81 having a source connected to a ground potential. Although the memory cells of the $E^2PROM$ have the structures analogous to those of MISFET's, the memory cells are different from the MISFET's in that the memory cells each have: a floating gate electrode on a first gate insulator contacted with a source and a drain, the floating gate electrode being separated from other regions; and a control gate electrode formed on the floating gate electrode, through a second gate insulator. Although each memory cell has the source connected to the ground potential and the control gate electrode connected to a word line also in the $E^2PROM$ similarly to the masked ROM the circuit diagram of which is shown in FIG. 4(a), drains of the memory cells are all connected to corresponding bit lines unlike the masked ROM. Recording of data in $E^2PROM$ is achieved by utilizing injection of electrons into the floating gates. In a memory cell where injection of electrons into a floating gate has not been achieved, making a control gate voltage High turns ON the memory cell and causes the bit line to be conducted to a ground potential, in case of a memory cell having a P-type semiconductor region (in case of a memory cell corresponding to an N-type MISFET), for example. However, in a memory cell where injection of electrons into a floating gate has been achieved, even making a control gate voltage High fails to turn ON the memory cell due to electrons accumulated in the floating gate so that the bit line is not conducted to the ground potential.

Writing of data, i.e., injection of electrons into the applicable floating gate, is achieved by applying a higher voltage to the associated gate. For example, assuming 9V of a control gate voltage, 0V of a source voltage, and 5V of a drain voltage, hot electrons are injected from the source into the floating gate, by a higher electric field between the gate and source. Further, erasing of data, i.e., extraction of electrons from the applicable floating gate is achieved by applying a lower voltage to the associated gate. For example, assuming −9V of a control gate voltage, 5V of a source voltage, and 0V of a drain voltage, electrons can be extracted from the floating gate toward the source by virtue of a tunnel effect, by a higher electric field between the gate and source.

FIG. 5(b) is a perspective view of a semiconductor memory of the present invention corresponding to the $E^2PROM$ shown in FIG. 5(a).

In FIG. 5(b), linear memory cells 85 are each formed intermittently with a plurality of memory cells in the longitudinal direction of the associated linear body. In the configuration shown in FIG. 5(b), the plurality of memory cells formed in each linear body have a mutually common source electrode and a mutually common gate electrode.

Each linear memory cell has the associated source electrode connected to a ground potential. Further, the gate electrode of each linear memory cell corresponds to the applicable word line shown in FIG. 5(a). Each linear body 85 is arranged on a contact layer 87 such that a drain electrode side is contacted with the contact layer 87. Arranged adjacently to the contact layer is a wiring layer 88. Although not shown, the contact layer 87 and wiring layer 88 are formed thereon with a contact pattern and a wiring pattern to be formed by a wiring formation method to be described later, respectively, to thereby realize the electrical connection among the memory cells in the circuit diagram shown in FIG. 5(a).

Figure 6:
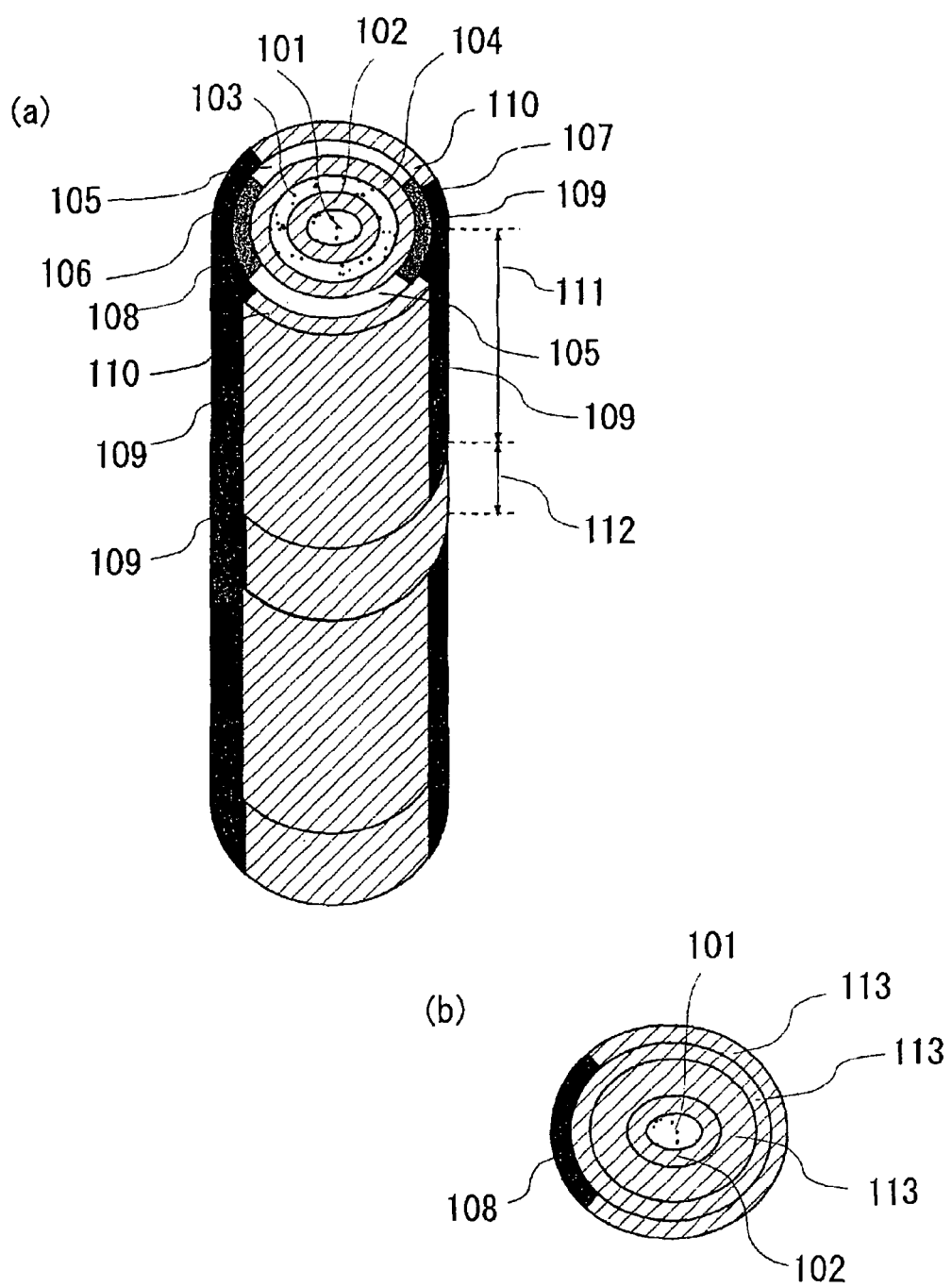
[FIG. 6] (a) and (b) are perspective view and cross-sectional view of a linear memory device constituting the integrated circuit of the present invention the perspective view of which is shown in FIG. 5(b).

FIG. 6(a) is a perspective view of linear memory cells of the present invention corresponding to the memory cells of the E$^2$PROM shown in FIG. 5(b). Each linear memory cell has in its cross-section a control gate electrode 101 at the center, and is sequentially formed outwardly thereof with a first gate insulator region 102, a floating gate electrode 103, a second gate insulator region 104, a source region 106, a drain region 107, and semiconductor regions 105. Additionally formed outside thereof are a source electrode 108, a drain electrode 109, and insulator regions 110. The source electrode 108 is formed circumferentially wider than the source region 106 and thus contacted with not only the source region 106 but also the semiconductor regions 105, and therefore, this enables the source electrode 108 to be electrically connected to the source region 106 and semiconductor regions 105 to thereby equalize the potential of the semiconductor regions 105 to that of the source electrode 108. Meanwhile, the drain electrode 109 is formed circumferentially narrower than the drain region 107, thereby preventing a short circuit between the drain electrode 109 and semiconductor regions 105.

Viewing the longitudinal direction of the linear device, device regions 111 and insulative separation regions 112 are alternately arranged. Although the control gate electrode and source electrode are continuously formed through the plurality of memory cells intermittently formed in the linear body, the floating gate electrodes, source regions, drain regions, semiconductor regions, and drain electrodes are electrically separated from one another by the insulative separation regions 112, respectively.

FIG. 6(b) is a cross-sectional view of the linear body in the insulative separation region 112. The control gate electrode 101 is arranged at the center of the cross-section, and is formed outwardly thereof with the insulator regions 102, 113 and source electrode 108.

(Image Sensor)

Figure 7:
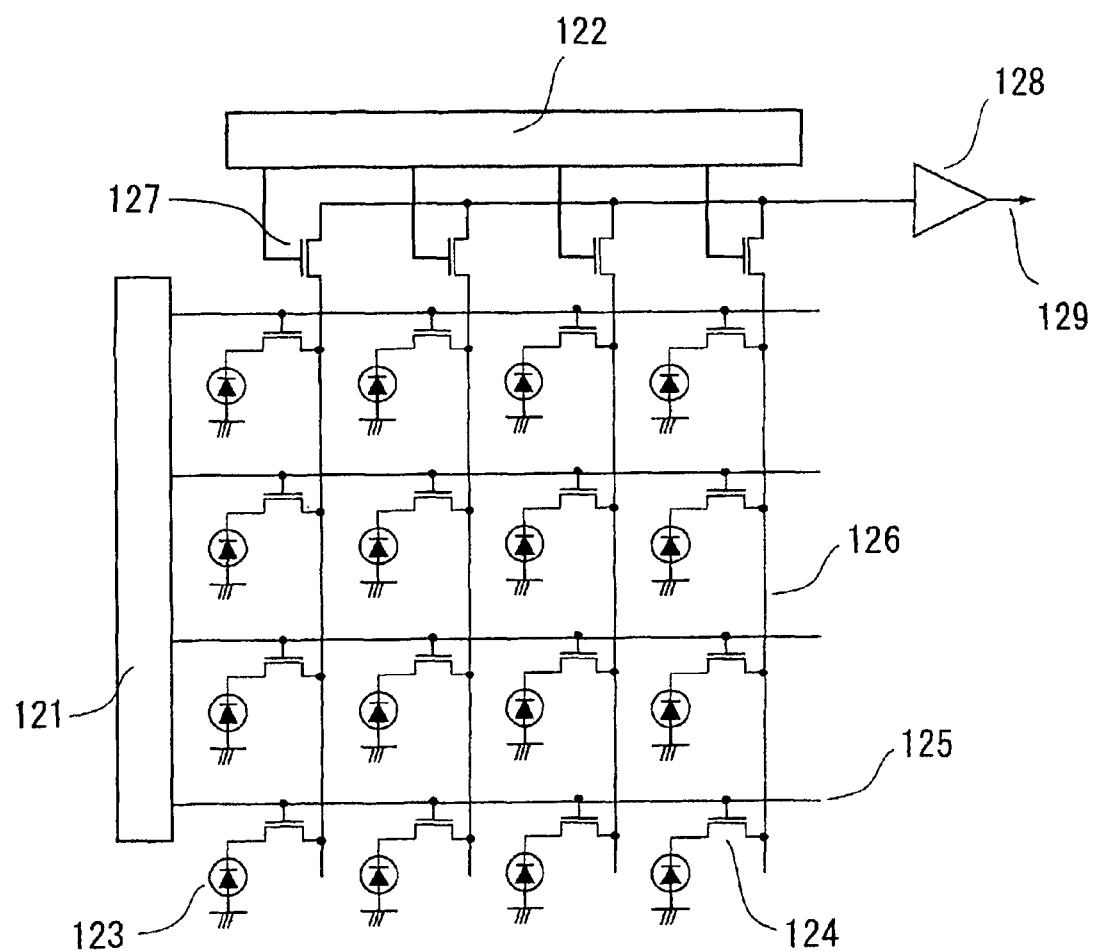
[FIG. 7] A circuit diagram for explaining a basic configuration of an image sensor.

FIG. 7 is a circuit diagram for explaining a basic configuration of an image sensor. The image sensor shown in FIG. 7 is constituted of: a pixel array including two-dimensionally arranged pixels each comprising a photodiode 123 and an N-type vertical switch MISFET 124; and a peripheral circuit comprising a vertical scanning circuit 121, a horizontal scanning circuit 122, horizontal switch MISFET's 127, and an output amplifier 128.

Irradiation of light to PN junctions constituting the photodiodes 123 generates electron-positive hole pairs, and generated electrons pass through the N-type cathode regions and are accumulated in the source regions of the vertical switch MISFET's 124 connected to the photodiodes, respectively. The vertical scanning circuit 121 for controlling the vertical switch MISFET's 124 functions as a shift register, so that one selection line of a plurality of vertical selection lines 125 is successively made High synchronizedly with a control signal such as a clock. MISFET's having gate electrodes connected to the selection line, which is made High, are turned ON. Similarly, controlling the horizontal scanning circuit 2 turns ON one MISFET of the plurality of horizontal switch MISFET's 127. Electrons accumulated in a source region of that vertical MISFET, the vertical switch MISFET and horizontal switch MISFET of which are simultaneously turned ON, are transferred to the output amplifier 128 and outputted from an output line 129.

Although there has been explained such a case that the MISFET's constituting pixels are N-type MISFET's in the above, it is possible to realize an image sensor even in a case of P-type MISFET's. For example, it is possible to realize the image sensor of the present invention even by using MISFET's utilizing an organic semiconductor where positive holes have larger mobilities than electrons depending on the type of the semiconductor material.

Further, although the image sensor is constituted of the vertical scanning circuit 121, horizontal scanning circuit 122, horizontal switch MISFET's 127, and output amplifier 128 in addition to the MISFET's and photodiodes constituting the pixels, it is also possible to form these circuits by the linear devices.

(Linear Device for Constituting Image Sensor)

Figure 8:
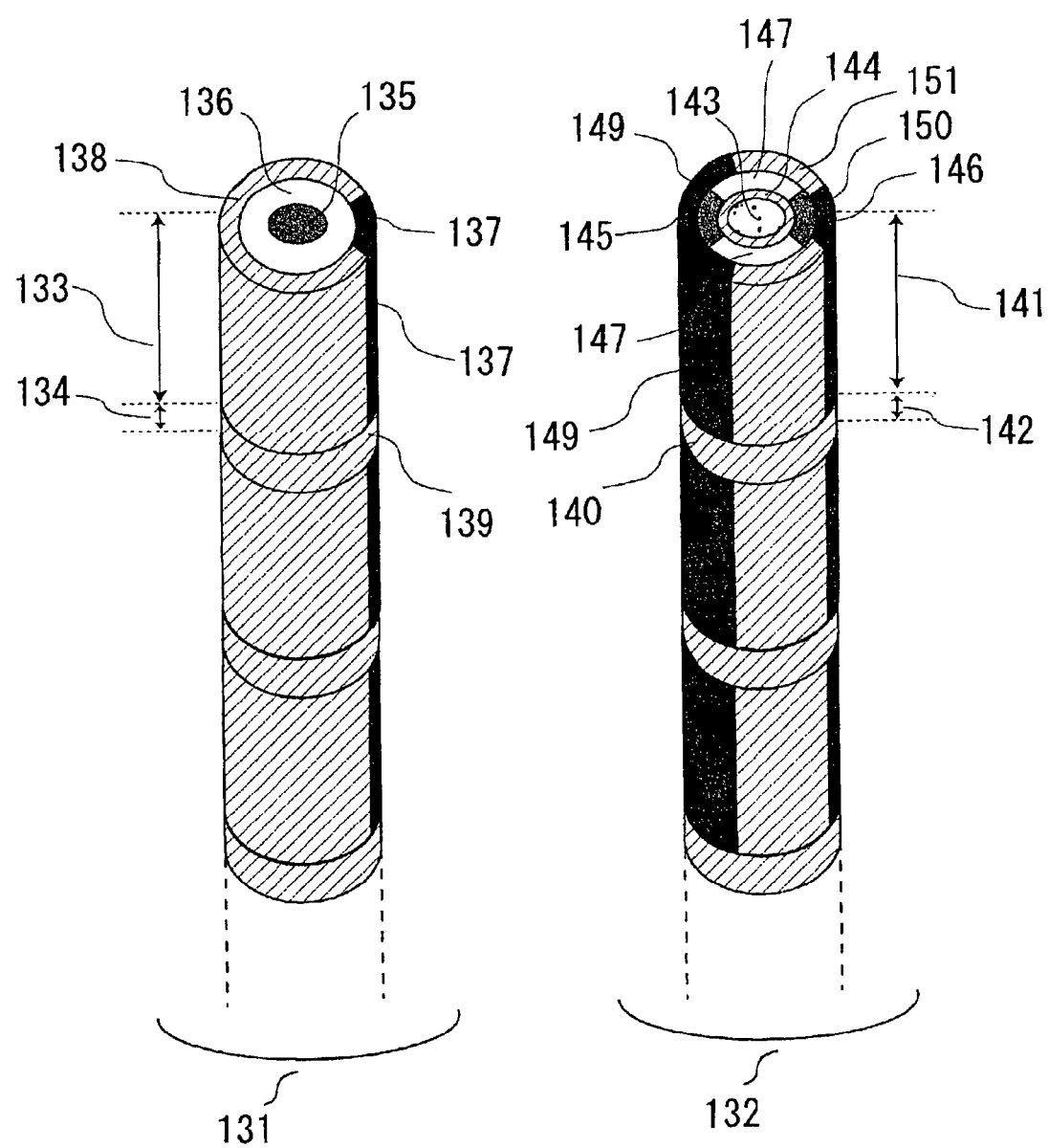
[FIG. 8] A perspective view of linear devices constituting an integrated circuit of the present invention the circuit diagram of which is shown in FIG. 7.

FIG. 8 is a perspective view of linear photodiodes and linear MISFET's constituting the image sensor of the present invention. The linear photodiodes 131 comprise a plurality of photodiodes intermittently formed in a single linear body. Similarly, the linear MISFET's 132 comprise a plurality of MISFET's intermittently formed in a single linear body.

In a cross section of the photodiode, the same has an anode region 135 comprising a P-type semiconductor region at the center, and is formed outwardly thereof with a cathode region 136 comprising an N-type semiconductor region, an insulator region 138, and a cathode electrode 137. The insulator region 138 comprises a material for transmitting light to be sensed therethrough, and is formed so that the PN junction comprising the anode region 135 and cathode region 136 is capable of sensing the light. Successively formed in the longitudinal direction of each linear photodiode are a device region 133 and an insulative separation region 134, and cathode regions 136 and cathode electrodes 137 of the photodiodes are electrically separated from one another by the insulative separation regions 134, respectively. Meanwhile, the anode region 135 is continuously formed at the center of the linear body.

In the longitudinal directions of the linear bodies, the device region 133 and cathode electrode 137 of the linear photodiode, and the device region 141 and source electrode 149 of the linear MISFET are desirably made to have the same length. Further, the insulative separation region 134 of the linear photodiode and an insulative separation region 142 of the linear MISFET are desirably made to have the same length. This allows paired photodiodes and MISFET's to be electrically connected to each other simply by positionally aligning the linear bodies and then adjacently contacting or adhering them to each other, thereby enabling facilitation of production of an image sensor.

Figure 9:
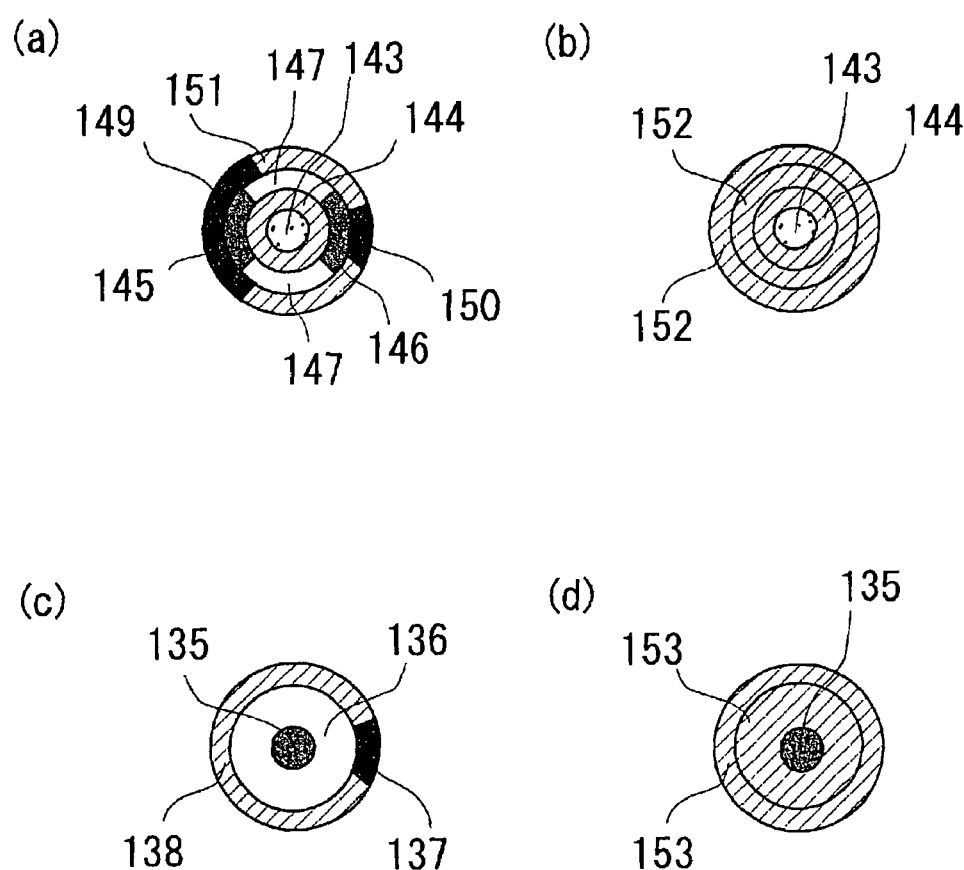
[FIG. 9] (a) through (d) are cross-sectional views of the linear device constituting the integrated circuit of the present invention shown in FIG. 8, respectively.

FIGS. 9(a) through (d) are cross-sectional views of the linear device the perspective view of which is shown in FIG. 8, respectively. FIG. 9(a) is a cross-sectional view at the device region 141 of the linear MISFET, and FIG. 9(b) is a cross-sectional view at the insulative separation region 142. Further, FIG. 9(c) is a cross-sectional view at the device region 133 of the linear photodiode, and FIG. 9(d) is a cross-sectional view at the insulative separation region 134.

As shown in FIG. 9(a), the device region of the MISFET has a gate electrode 143 at the center, and is formed outwardly thereof with a gate insulator region 144, a source region 145, a drain region 146, and semiconductor regions 147. Additionally formed outside thereof are a source electrode 149, a drain electrode 150, and insulator regions 151. The source electrode 149 is formed circumferentially wider than the source region 145 and thus contacted with not only the source region 145 but also the semiconductor regions 147, and therefore, this enables the source electrode 149 to be electrically connected to the source region 145 and semiconductor regions 147 to thereby equalize the potential of the semiconductor regions 147 to that of the source electrode 149. Meanwhile, the drain electrode 150 is formed circumferentially narrower than the drain region 146, thereby preventing a short circuit between the drain electrode 150 and semiconductor regions 147.

As shown in FIG. 9(b), in the insulative separation region of the MISFET, the insulator regions 144 and 152 are formed around the gate electrode 143, thereby electrically separating the source region, drain region, and semiconductor regions of the MISFET from those of an adjacent MISFET, respectively.

As shown in FIG. 9(c), the device region of the photodiode has the anode region 135 at a center, and is sequentially formed outwardly thereof with the cathode region 136, cathode electrode 137, and insulator region 138.

As shown in FIG. 9(d), the insulative separation region of the photodiode is formed with an insulator region 153 around the anode region 135, thereby electrically separating the cathode electrode of the photodiode from that of an adjacent photodiode.

Although the source region 145, source electrode 149, drain region 146, drain electrode 150, and semiconductor regions 147 in the linear MISFET are electrically separated from a device region of the adjacent MISFET by the insulator region 140, the gate electrode 143 is continuous through a plurality of MISFET's constituting the linear MISFET's. This allows for the vertical selection lines 125 shown in FIG. 7 to be readily formed.

Although the cathode region 136 and cathode electrode 137 in the linear photodiode are electrically separated from a device region of the adjacent linear photodiode by the insulator region 139, the anode region 135 is continuous through a plurality of photodiodes constituting the linear photodiodes. This allows for the wiring shown in FIG. 7 from the photodiode to a ground potential to be readily formed.

Although there has been explained the image sensor in the above in such a scheme that photodiodes are adopted as a photoelectric conversion device, and signals of pixels in an X-Y plane are selected and taken out by digital shift registers such as a vertical scanning circuit, a horizontal scanning circuit, or the like, it is also possible to obtain the effect of the present invention by forming SIT's or a CCD by linear devices even in a case where the SIT's are adopted as a photoelectric conversion device, or in a case of adopting a scheme for transferring signals of a photoelectric conversion device to an output circuit by an analog shift register based on the CCD.

Figure 10:
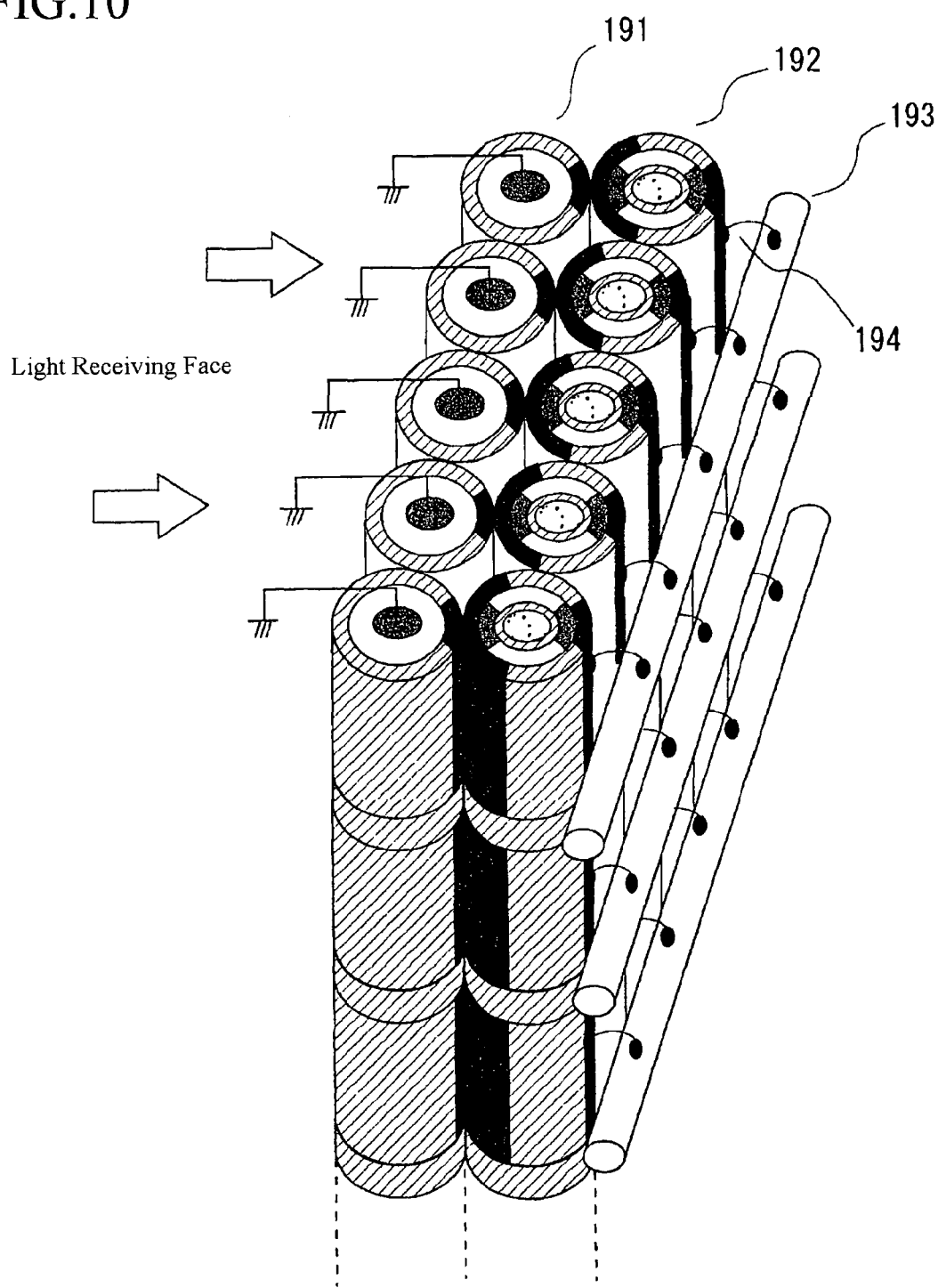
[FIG. 10] A perspective view of the integrated circuit of the present invention the circuit diagram of which is shown in FIG. 7.

FIG. 10 is a perspective view of the image sensor of the present invention. The image sensor of the present invention is constituted of: a plurality of linear photodiodes 191 arranged at a light receiving face side; a plurality of linear MISFET's 192 arranged adjacently to the linear photodiodes 191, respectively; and vertical signal lines 193 for transferring image signals, respectively. The linear photodiodes 191 comprise a plurality of photodiodes intermittently formed in linear bodies and separated from one another by insulative separation regions, respectively. However, each anode region arranged at a center of cross sections of the associated photodiodes is continuous through the associated linear body, and is connected to a ground potential. The linear MISFET's 192 comprise a plurality of MISFET's intermittently formed in the linear bodies and separated from one another by the insulative separation regions, respectively. Also in the linear MISFET's, each gate region at a center of a cross section is continuous through the associated linear body, and is connected to vertical selection lines as control signal lines of the MISFET's. Cathode region arranged around the anode regions of the linear photodiodes 191 are connected to source regions of adjacently arranged MISFET's, through the cathode electrodes and source electrodes, respectively. Further, the drain regions of the linear MISFET's 192 are connected to vertical signal lines 193 through the drain electrodes and drain contacts 194, respectively. Although the drain contacts 194 are shown to be connected by black dots and lines as expediency in FIG. 10, connections in an actual image sensor are achieved by electrical connections by electroconductive materials made of a photoreactive organic material or the like, by using a wiring formation method to be described later herein.

(Programmable Logic Array)

Figure 11:
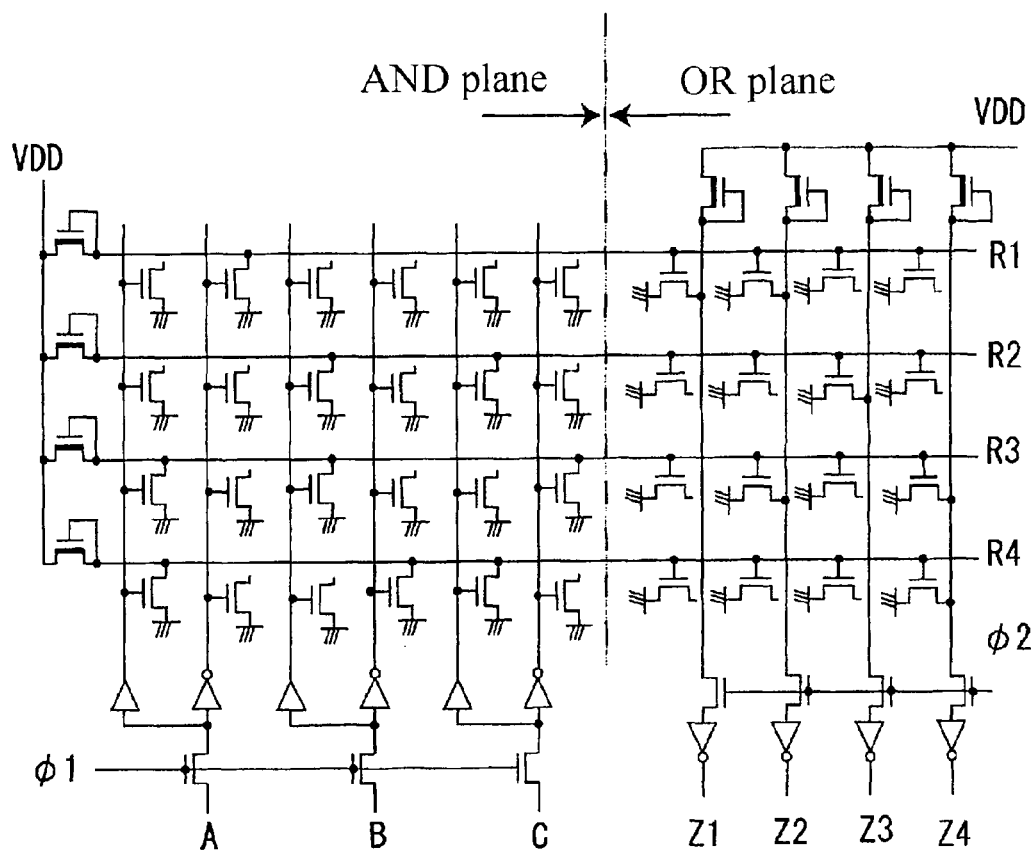
[FIG. 11] A circuit diagram of a PLA constituted of an AND plane and an OR plane.

FIG. 11 is a circuit diagram for explaining a structure of a PLA constituted of an AND plane and an OR plane. Input signals A, B, and C are inputted into a transistor array called an "AND plane", through passage control transistors, inverting buffers, and non-inverting buffers controlled by a clock φ1. Outputs of the AND plane are transmitted to the OR plane through signal paths R1, R2, R3, and R4, respectively, represented by horizontal lines and connected with pull-up transistors at left ends thereof, respectively. In consideration of a logical formula of the R3, the R3 becomes LOW when the A, B, or C is HIGH, so that the following formula is obtained:

$$R3 = {}^-(A|B|{}^-C) = {}^-A * {}^-B * C$$

Similarly, in consideration of a logical formula of the R4, the following formula is obtained:

$$R4 = {}^-(A|{}^-B|C) = {}^-A * B * {}^-C$$

Outputs of the OR plane are stored in output registers comprising passage control transistors and inverters controlled by a clock φ2, respectively.

Considering Z4 as an output of the PLA (output of the OR plane), for example, the output register of the Z4 has an input signal line which becomes LOW when the R3 or R4 is HIGH, so that the following formula is obtained:

$$Z4 = {}^-({}^-(R3|R4)) = ({}^-A*{}^-B*C)|({}^-A*B*{}^-C)$$

Although the example shown in FIG. 11 has been explained for a case for realizing an extremely simple logical formula, it is possible to realize arbitrary combined logics by PLA's in a manner to select connection and unconnection of drains of transistor arrays, respectively. Although the PLA of FIG. 11 is shown for a circuit configuration in a case where all the MISFET's constituting the transistor array are N-type MISFET's, it is easy to realize a PLA comprising P-type MISFET's even in a case of constituting a transistor array by P-type MISFET's, by a simple circuit change such as connection of each source to a power supply potential, exchange of pull-up transistors with pull-down transistors, or the like. It is thus possible to realize the PLA of the present invention even by using MISFET's utilizing an organic semiconductor where positive holes have larger mobilities than electrons depending on the type of the semiconductor material, for example.

Further, although the PLA is constituted of inverters, signal passage transistors, pull-up transistors or pull-down transistors, in addition to the transistor array constituting the AND plane and OR plane as shown in FIG. 11, these circuits can also be formed by using the linear devices.

(Linear Devices for Constituting PLA)

Figure 12:
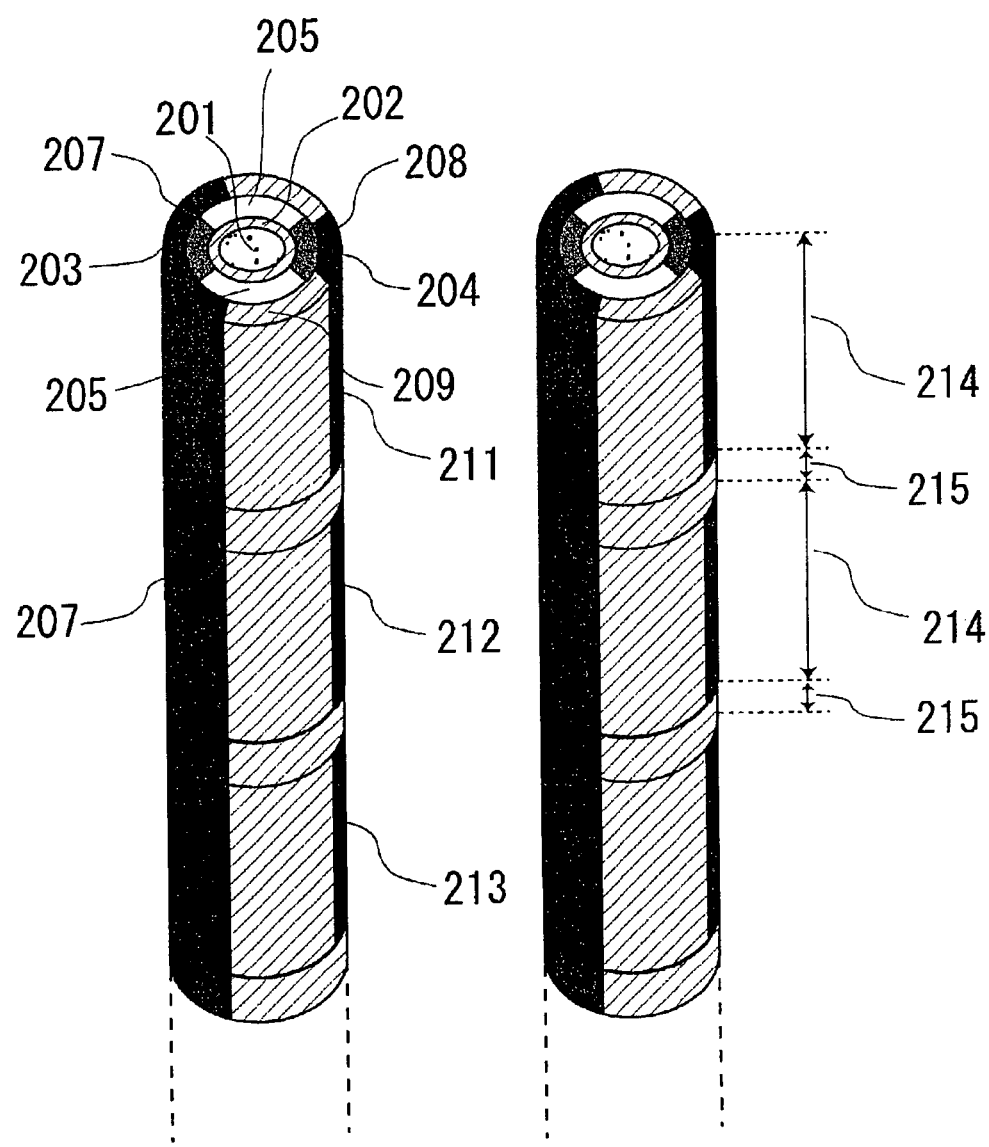
[FIG. 12] A perspective view of a linear device constituting the integrated circuit of the present invention the circuit diagram of which is shown in FIG. 11.

FIG. 12 is a perspective view of linear MISFET's constituting the PLA of the present invention. The linear MISFET comprises a plurality of MISFET's intermittently formed in a single linear body. Alternately formed in the longitudinal direction of the MISFET's are device regions 214 and insulative separation regions 215, respectively, and the MISFET's are electrically separated from one another by the insulative separation regions 215, respectively. However, gate electrodes and source electrodes are formed continuously through the plurality of MISFET's formed in the linear bodies, respectively.

Figure 13:
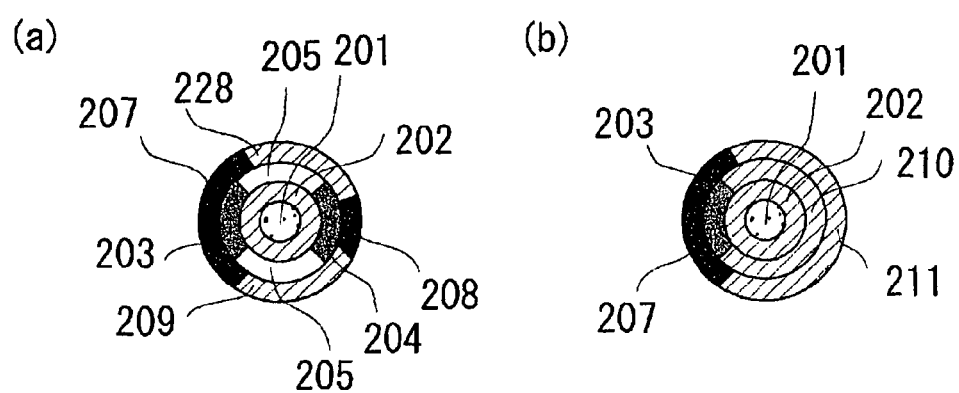
[FIG. 13] (a) and (b) are cross-sectional views of the linear device constituting the integrated circuit of the present invention shown in FIG. 12.

FIGS. 13(a) and (b) are cross-sectional views of the linear devices the perspective view of which is shown in FIG. 12. FIG. 13(a) is the cross-sectional view at a device region 214 of the linear MISFET, and FIG. 13(b) is the cross-sectional view at an insulative separation region 215.

As shown in FIG. 13(a), the device region of the MISFET has a gate electrode 201 at a center, and is formed outwardly thereof with a gate insulator region 202, a source region 203, a drain region 204, and semiconductor regions 205. Additionally formed outside thereof are a source electrode 207, a drain electrode 208, and insulator regions 228. The source electrode 207 is formed circumferentially wider than the source region 203 and thus contacted with not only the source region 203 but also the semiconductor regions 205, and therefore, this enables the source electrode 207 to be electrically connected to the source region 203 and semiconductor regions 205 to thereby equalize the potential of the semiconductor regions 205 to that of the source electrode 207. Meanwhile, the drain electrode 208 is formed circumferentially narrower than the drain region 204, thereby preventing a short circuit between the drain electrode 208 and semiconductor regions 205.

As shown in FIG. 13(b), the insulative separation region 215 of the MISFET is formed with insulator regions 202, 210, and 211 around the gate electrode 201, thereby electrically separating the drain region and semiconductor regions from those of an adjacent MISFET, respectively. Meanwhile, the electroconductive source electrode 207 and source region 203 are formed in the insulative separation region 215 as well, thereby electrically connecting the source regions of the MISFET's formed in the linear body to one another.

(AND Plane of PLA)

Figure 14:
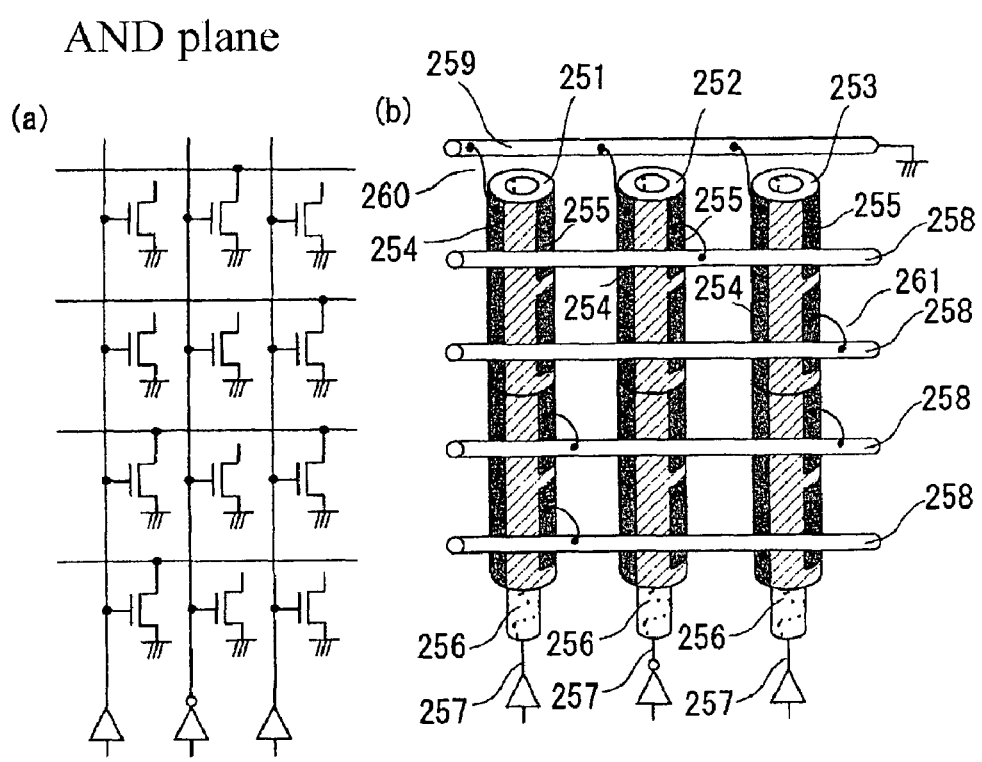
[FIG. 14] (a) is a circuit diagram of the AND plane of the PLA, and (b) is a perspective view of the integrated circuit of the present invention corresponding to the circuit diagram shown in (a).

FIG. 14(a) is a circuit diagram of the AND plane of the PLA, and FIG. 14(b) is a perspective view of the PLA of the present invention corresponding to the circuit diagram shown in FIG. 14(a). In FIG. 14(a), intermittently formed in a linear body 251 are a plurality of MISFET's, in the longitudinal direction of the linear body. In the configuration shown in FIG. 14(b), the plurality of MISFET's formed in each linear body have a mutually common source electrode 254 and a mutually common gate electrode 256. AND plane input wirings 257 are connected to the gate electrodes 256, respectively, and source electrodes 254 are connected to a ground wiring 259 via source contacts 260, respectively. Only those MISFET's among the plurality of formed MISFET's, respectively, which are required for realizing a function of the PLA, have drain electrodes 255 on the linear bodies connected to AND plane output wirings 258 via drain contacts 261, respectively.

(OR Plane of PLA)

Figure 15:
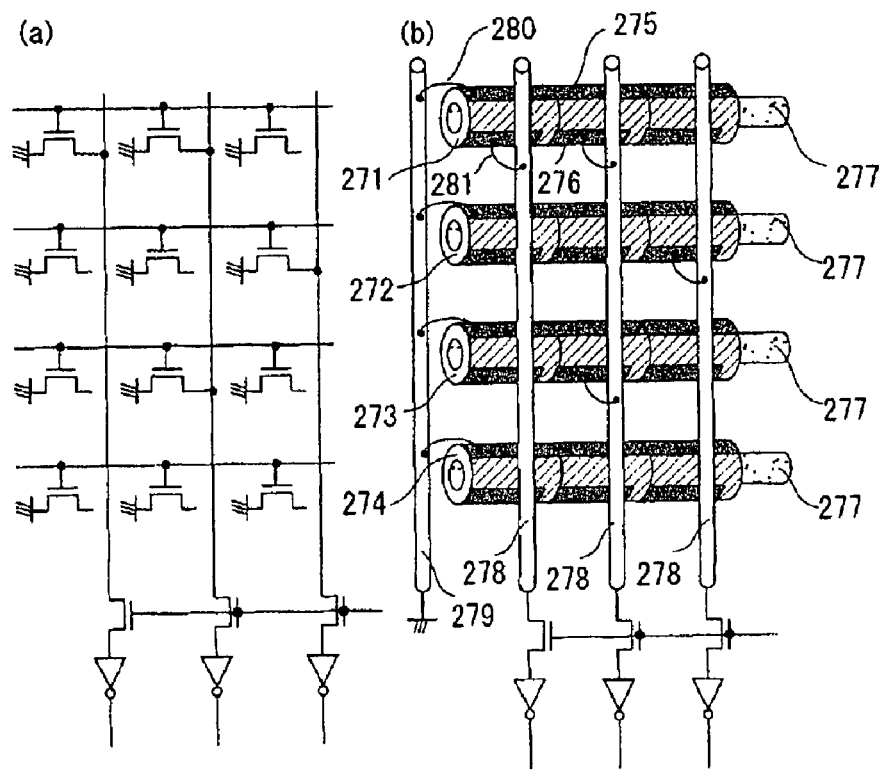
[FIG. 15] (a) is a circuit diagram of the OR plane of the PLA, and (b) is a perspective view of the integrated circuit of the present invention corresponding to the circuit diagram shown in (a).

FIG. 15(a) is a circuit diagram of the OR plane of the PLA, and FIG. 15(b) is a perspective view of the PLA of the present invention corresponding to the circuit diagram shown in FIG. 15(a). In FIG. 15(b), intermittently formed in a linear body 271 are a plurality of MISFET's, in the longitudinal direction of the linear body. In the configuration shown in FIG. 15(b), the plurality of MISFET's formed in each linear body has a mutually common source electrode 275 and a mutually common gate electrode 277. OR plane input wirings are connected to the gate electrodes 277, respectively, and source electrodes 275 are connected to a ground wiring 279 via source contacts 280, respectively. Only those MISFET's among the plurality of formed MISFET's, respectively, which are required for realizing a function of the PLA, have drain electrodes 276 on the linear bodies connected to OR plane output wirings 278 via drain contacts 281, respectively.

Although the source contacts 260 and drain contacts 261 in the AND plane of the PLA of the present invention shown in FIG. 14(b), or the source contacts 280 and drain contacts 281 in the OR plane of the PLA of the present invention shown in FIG. 15(b) are shown to be connected by black dots and lines as expediency in the perspective views, connections in an actual PLA are achieved by electrical connections by electroconductive materials made of a photoreactive organic material or the like, by using a wiring formation method to be described later herein.

(Shape, Material, and Production of Linear Device)

(Shape of Linear Device)

It is desirable that the linear devices of the present invention are each 10 mm or less, preferably 5 mm or less in outer diameter. 1 mm or less is desirable, and 10 µm or less is more desirable. It is also possible to attain 1 µm or less, and even 0.1 µm or less, by conducting stretch working.

In case of eventually forming an extrafine linear body having an outer diameter of 1 µm or less by discharging it from a hole of a die, there may be caused clogging of the hole, breakage of a thread-like body, or the like. In such a case, there are firstly formed linear bodies of respective regions. Next, these linear bodies may be regarded as many islands, respectively, which are then each surrounded at a periphery (sea) thereof by a meltable matter and subsequently bundled up by a funnel-shaped nozzle followed by discharge into a single linear body. Increasing island components and decreasing sea components enables formation of an extremely fine linear body device. As another method, it is possible to once prepare a thick linear body device, and to subsequently extend it in a longitudinal direction thereof. Alternatively, it is also possible to place a molten starting material(s) into a jet stream to thereby melt blow it into an extrafine one.

Meanwhile, it is possible to attain an aspect ratio of an arbitrary value by extrusion forming. 1,000 or more is desirable in case of a thread shape by spinning. 100,000 or more is also possible, for example. In case of usage after cutting, 10 to 10,000, 10 or less, 1 or less, and 0.1 or less is possible, for small units of linear devices.

The linear device is not particularly limited in cross-sectional shape. For example, it may be circular, polygonal, star-shaped, and so on. It may be a polygonal shape having a plurality of apex angles each defining an acute angle. In turn, it is possible that respective regions each have an arbitrary cross section. Depending on a type of device, it is desirable to provide a region layer in a polygonal shape having apex angles each defining an acute angle, in case of intending a wider contacting area between the region layer and a neighboring one. Note that it is possible to easily realize a desired cross-sectional shape, by preparing an extrusion die in the desired shape. In case that an outermost layer is in a star shape or in a shape having apex angles each defining an acute angle, it is possible to fill an arbitrary material(s) into spaces between neighboring apexes such as by dipping after extrusion forming, thereby changing a property of a device depending on the usage thereof.

In case that the linear body constituting the linear device of the present invention is simultaneously formed with a linear photoelectric conversion device such as a light emitting device, displaying device, photocell, photosensor, and the like, the photoelectric conversion device is allowed to have an increased surface area to effectively improve a photoelectric conversion efficiency, by causing the linear device to have a cross-sectional shape which is polygonal, star-shaped, crescent-shaped, petal-shaped, character-shaped, and so on having an increased surface area.

(Material of Linear Device)

In case of a linear device which is an N-type MISFET, it includes: a gate electrode formed of a P-type or N-type semiconductor material or electroconductive material; a semiconductor region formed of a P-type semiconductor material; and a source region and a drain region each formed of an N-type semiconductor material or electroconductive material. Further, it includes a gate insulator region and a surface protection region each formed of an insulating material.

Further, in case of a linear device which is a P-type MISFET, it includes: a gate electrode formed of a P-type or N-type semiconductor material or electroconductive material; a semiconductor region formed of an N-type semiconductor material; and a source region and a drain region each formed of a P-type semiconductor material or electroconductive material. Further, it includes a gate insulator region and a surface protection region each formed of an insulating material.

As a semiconductor material and an electroconductive material for forming the linear device of the present invention, it is desirable to adopt an organic semiconductor or electroconductive polymer. Adopting the organic semiconductor or electroconductive polymer decreases a material cost and simplifies a production process, thereby effectively decreasing a production cost.

Usable as an electroconductive polymer are polyacetylenes, polyacenes, polythiophenes, poly(3-alkylthiophene), oligothiophene, polypyrrole, polyaniline, polyphenylenes, and the like. It is preferable to select one(s) of them as an electrode or semiconductor layer in consideration of an electrical conductivity and the like. For an electroconductive polymer, it is desirable to mix fullerene or containing-fullerene therewith. Desirable as fullerene is Cn (n=60 to 90). Desirable as a contained atom(s) of containing-fullerene is Na, Li, H, N, or F.

Further, preferably used as an organic semiconductor are polyparaphenylenes, polythiophenes, poly(3-methylthiophene), polyfluorenes, polyvinylcarbazole, or the like.

Moreover, usable as a material of a source/drain region or semiconductor region, is the above-described semiconductor material including a dopant mixed therewith.

For establishment of an N-type semiconductor, it is enough to adopt alkali metal (Li, Na, K), $AsF_5/AsF_3$, $ClO_4^-$ as a dopant, for example.

For establishment of a P-type semiconductor, it is enough to adopt halogen ($Cl_2$, $Br_2$, $I_2$, or the like), Lewis acid ($PF_5$, $AsF_5$, $SbF_5$, or the like), proton acid (HF, HCl, $HNO_3$, or the like), transition metal compound ($FeCl_3$, FeOCl, $TiCl_4$, or the like), electrolyte anion ($Cl^-$, $Br^-$, $I^-$, or the like) as a dopant, for example.

Further, usable as an insulating material for the gate insulator region constituting the linear device of the present invention, are PVDF (polyvinylidene fluoride), PS (polystyrene), PMMA (polymethylmethacrylate), and PVA (polyvinyl alcohol), for example.

Moreover, usable as an insulating material for the surface protection region or separation region constituting the linear device of the present invention, are PVDF (polyvinylidene fluoride), PS (polystyrene), PMMA (polymethylmethacrylate), PVA (polyvinyl alcohol), PC (polycarbonate), PET (polyethylene terephthalate), and PES (polyether sulphone), for example.

(Production Apparatus and Production Method)

Figure 22:
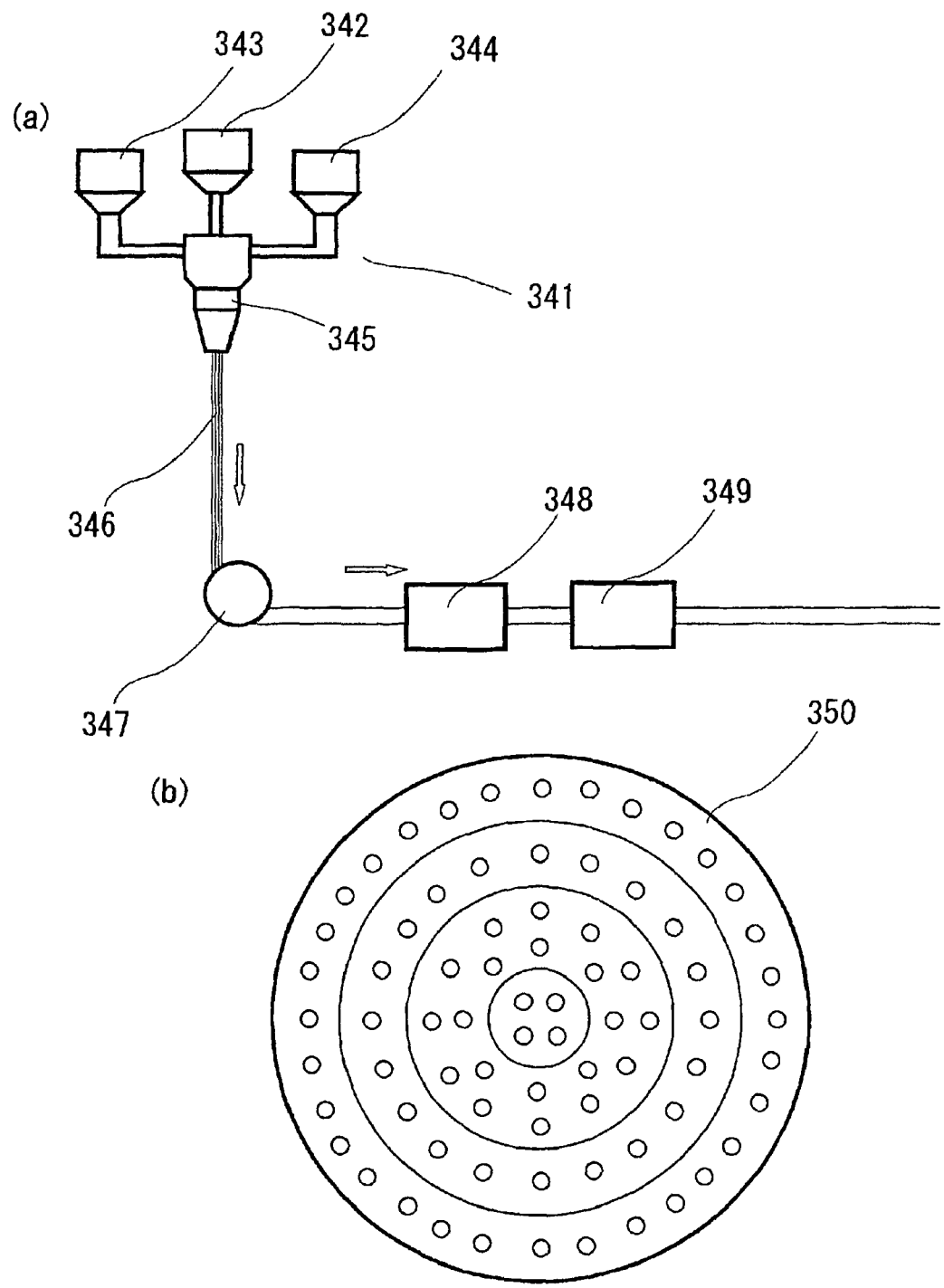
[FIG. 22] (a) is a front view of an extrusion apparatus to be used for production of a linear device. (b) is a plan view of a die to be used for production of the linear device.

FIG. 22(a) is a front view of a production apparatus of the linear device of the present invention, and FIG. 22(b) is a plan view of a die to be used for production of the linear device of the present invention.

Reference numeral 341 designates an extrusion apparatus having starting material reservoirs 342, 343, and 344 for holding therein starting materials in molten states, dissolved states, or gel states so as to constitute a plurality of regions, respectively. Although the three starting material reservoirs are presented in the example shown in FIG. 22(a), it is possible to appropriately provide starting material reservoirs correspondingly to a configuration of a linear device to be produced.

Starting material in the starting material reservoirs 342, 343, and 344 are fed to a die 345. The die 345 is formed with ejection holes commensurating with a cross section of a linear device to be produced. To be collectively ejected from the ejection holes is a linear body which is wound up by a roller 347 or which is delivered to a next process as required in the as-linearized state.

The starting material reservoirs 342, 343, and 344 hold therein a gate electrode material, a gate insulator region material, a source material, a drain material, and a semiconductor material in a molten or dissolved state, or a gel state, respectively. Meanwhile, the die 345 is formed with holes communicated with the material reservoirs, respectively.

As shown in a plan view of FIG. 22(b), the die 345 is formed at its central part with a plurality of holes for ejecting the gate electrode material. Outwardly and peripherally formed around the holes are a plurality of holes for ejecting the gate insulator region material. Further, outwardly and peripherally formed around the holes are a plurality of holes for ejecting the source material, drain material, and semiconductor material, respectively. However, it is enough in the die 345 that the arrangement of the pluralities of holes for ejecting the materials corresponding to a circuit region is appropriately set correspondingly to a cross-sectional structure of a linear device to be actually produced, and it is not absolutely required that holes for ejecting a gate electrode material are arranged centrally.

The starting materials in a molten or dissolved state, or a gel state are fed from the starting material reservoirs into the die 345, ejected from the die through the holes, and then solidified. Pulling an end of the solidified matter forms a continuous and linear light emitting device in a thread shape. The linear device is wound up by the roller 347. Alternatively, the solidified matter in the thread shape is delivered to the next process as required.

Formation of Extraction Electrode: To contact an extraction electrode with a source region or drain region, there is removed a part of a semiconductor region by a method such as mechanical working, etching, or the like before formation of the electrode. The extraction electrode is formed at an electrode formation treatment part 349, by selectively conducting coating of an electroconductive polymer, vapor deposition of Al, or the like, for example.

Formation of Surface Protection Region: Although not shown in FIG. 22, there is provided a treatment part for coating an insulating material as required, thereby coatingly forming an insulating region at a surface of a linear body constituting a linear device.

Formation of Separation Region: There is selectively removed an electroconductive region or semiconductor region which is intended to be separated, by a method such as mechanical working, etching, or the like, at a portion where the separation region is to be formed. The removed region is coated and formed with an insulating region. Further, it is possible to inject oxygen ions at a doping treatment part 348 followed by heating, thereby forming an insulative separation region.

(Wiring Formation Method)

Figure 23:
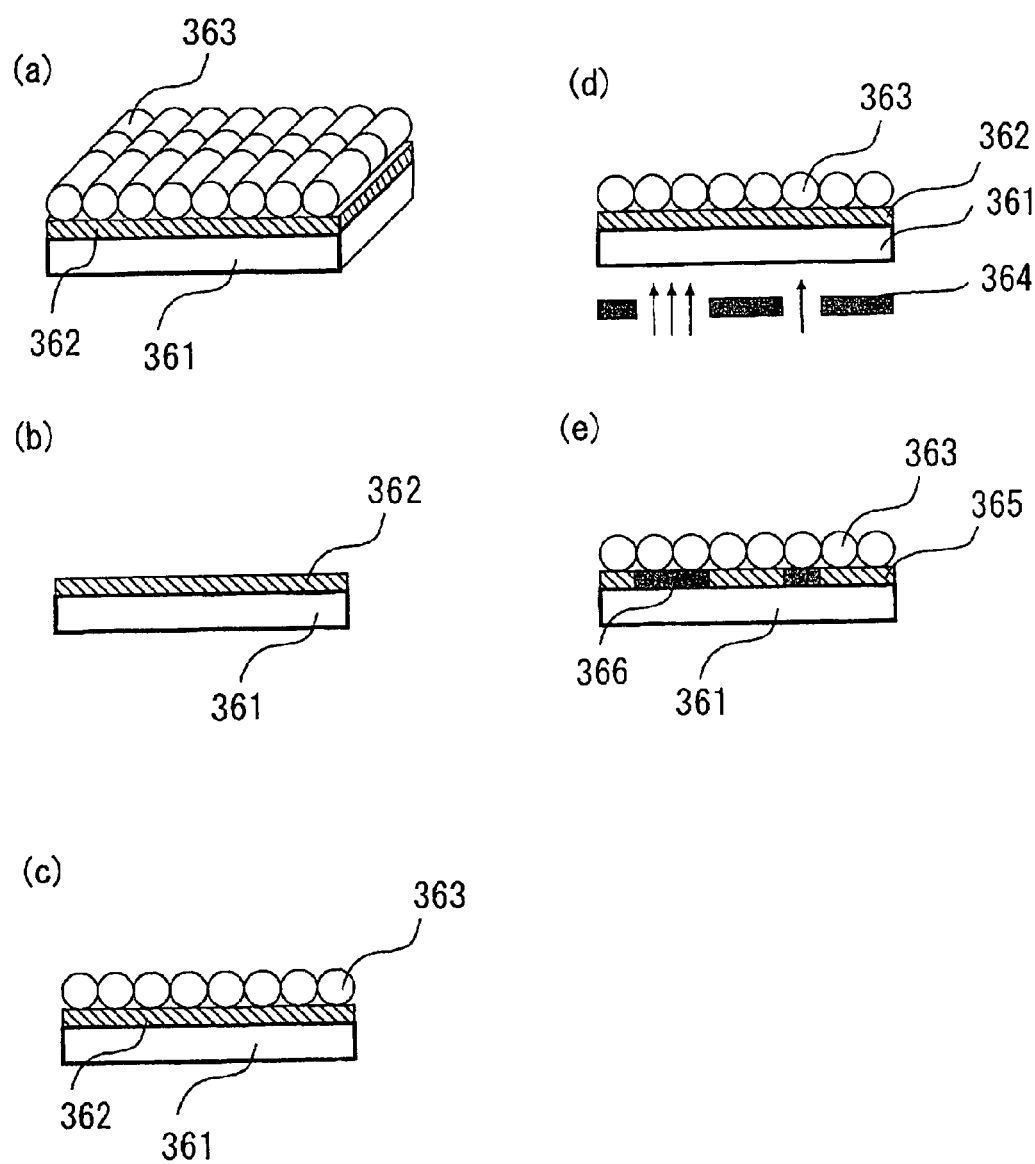
[FIG. 23] Relating to a wiring formation method of an integrated circuit of the present invention, (a) is a perspective view of an integrated circuit in a wiring formation process, and (b) through (e) are cross-sectional views of the wiring formation process in an order of steps, respectively.
Figure 24:
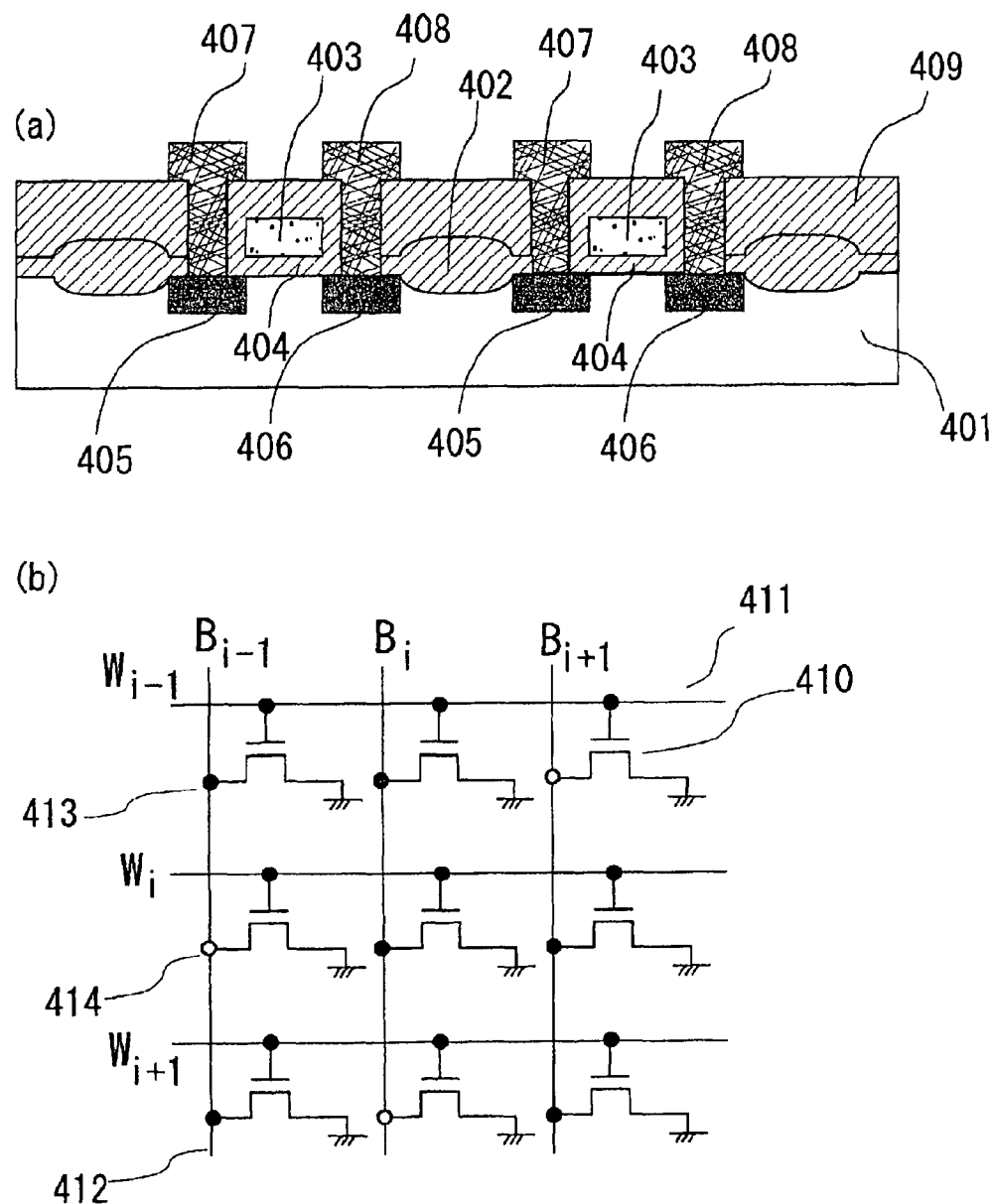
[FIG. 24] (a) is a cross-sectional view of a planar device constituting a conventional semiconductor memory or PLA, and (b) is a circuit diagram of a masked ROM.
Figure 25:
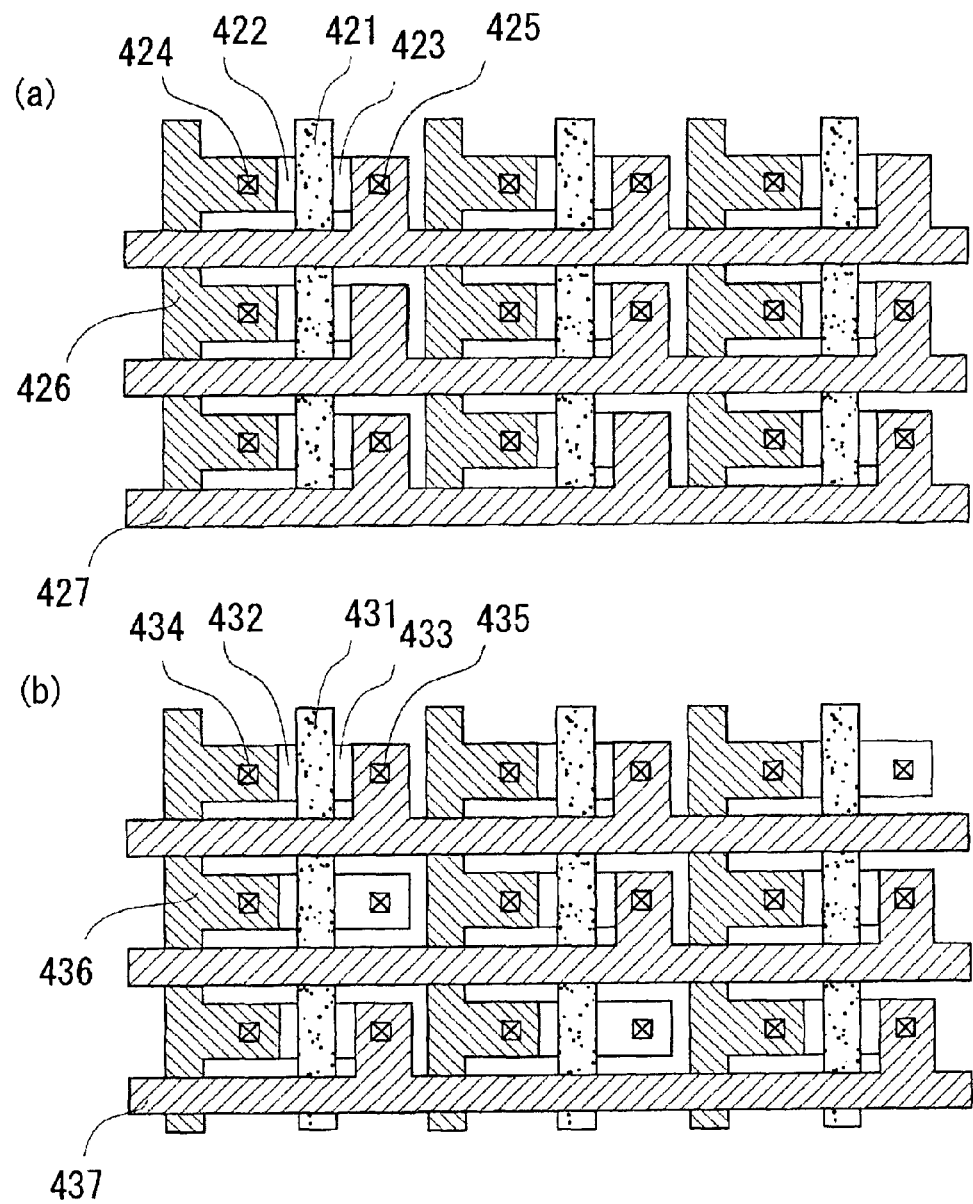
[FIG. 25] (a) and (b) are plan views of the conventional masked ROM, respectively.
Figure 26:
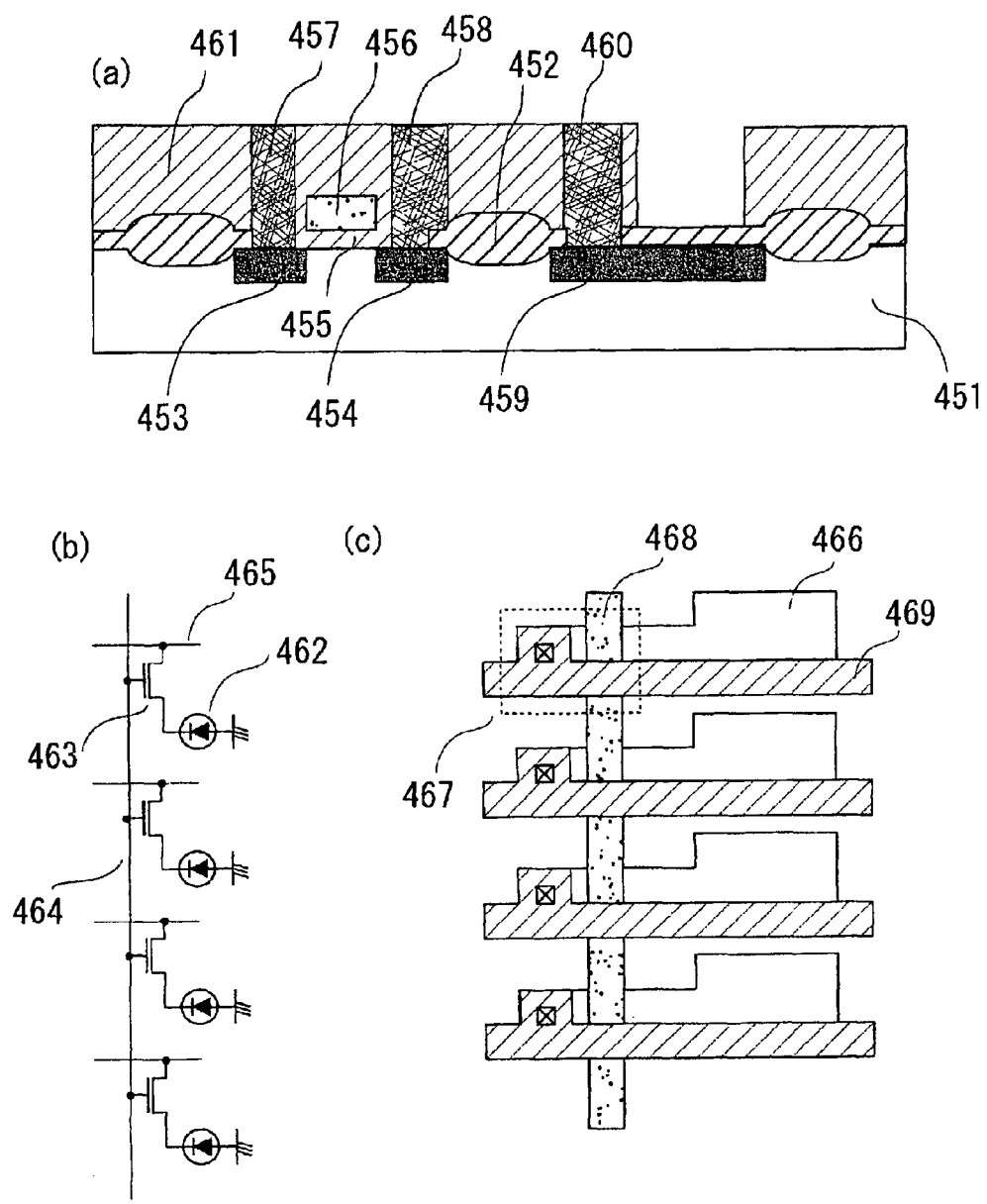
[FIG. 26] (a) is a cross-sectional view of a planar device constituting a conventional image sensor, and (b) is a partial circuit diagram of the image sensor, and (c) is a plan view of the conventional image sensor corresponding to (b).
Figure 27:
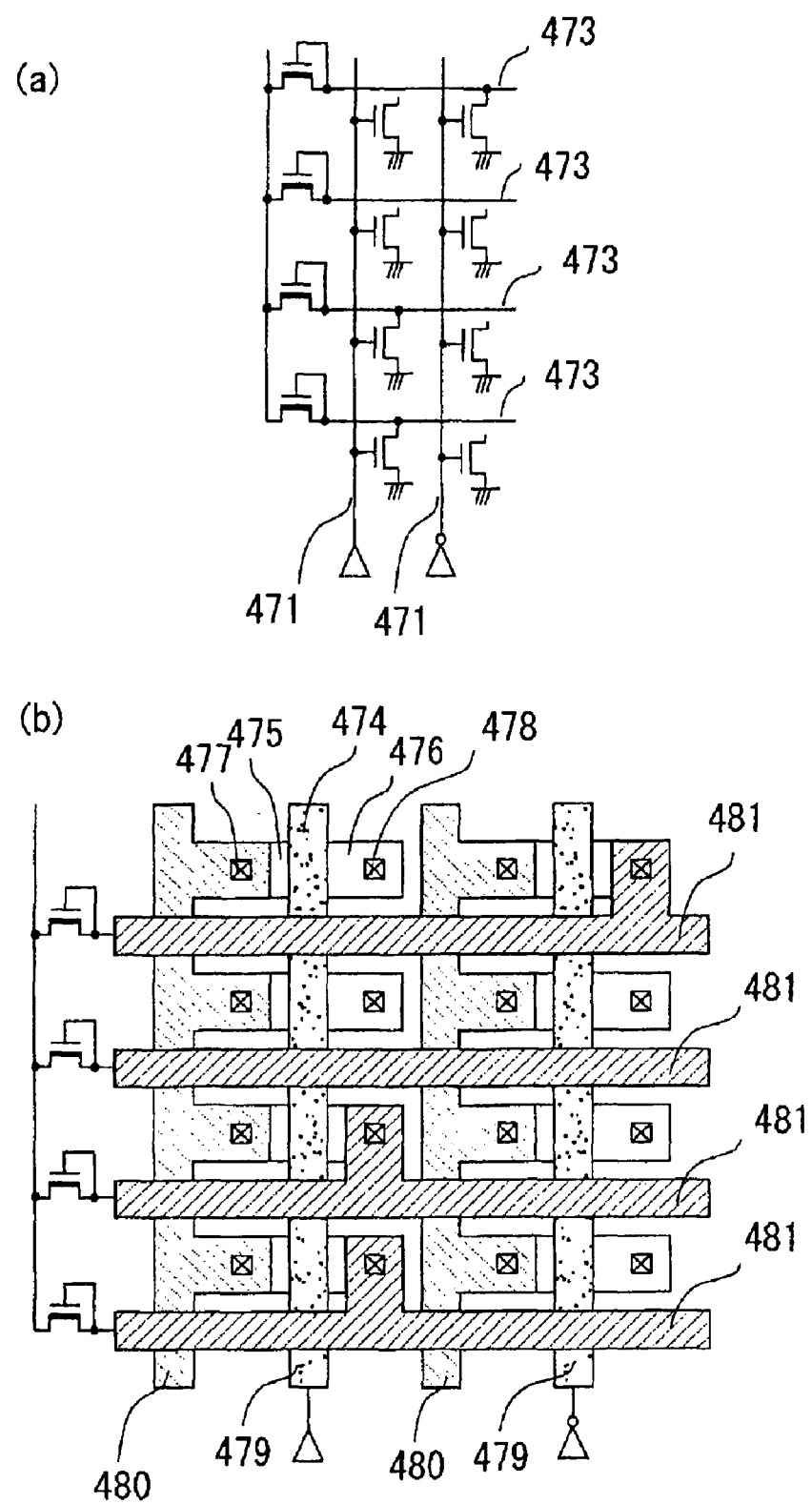
[FIG. 27] (a) is a circuit diagram of an AND plane of the conventional PLA, and (b) is a plan view of the conventional PLA corresponding to (a).
Figure 28:
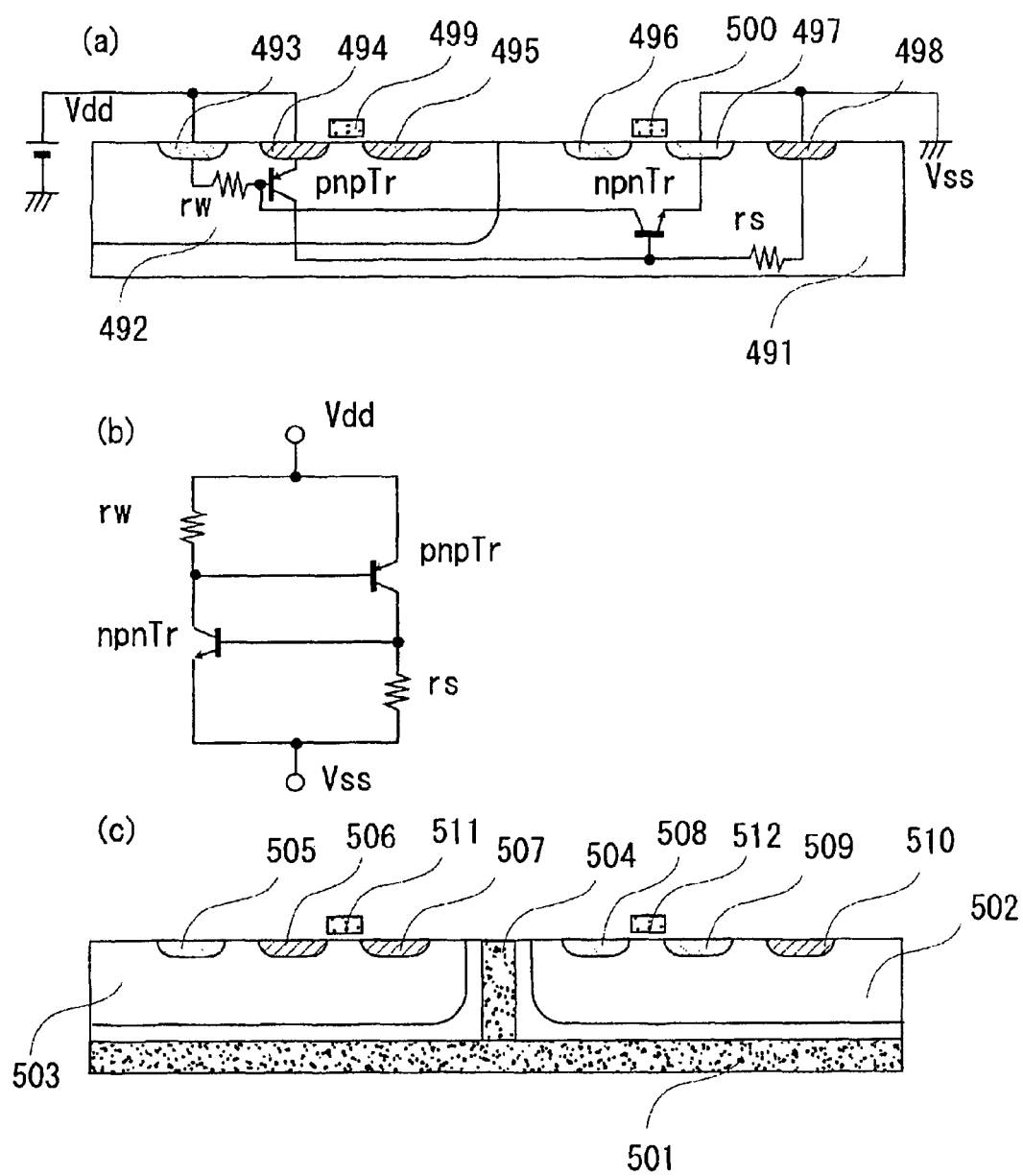
[FIG. 28] (a) is a cross-sectional view showing a structure of a conventional complementary MISFET. (b) is a circuit diagram for explaining a cause of occurrence of latch-up in the conventional complementary MISFET. (c) is a cross-sectional view showing a structure of another conventional complementary MISFET.

FIG. 23 relates to a wiring formation method of an integrated circuit of the present invention, and (a) is a perspective view of an integrated circuit in a wiring formation process, and (b) through (e) are cross-sectional views of the wiring formation process in an order of steps, respectively. Firstly, there is formed a photoreactive organic film 362 on a substrate 361 made of glass or plastics, for example, by a rotation coat method or the like (FIG. 23(b)). As the photoreactive organic film, there is used an organic material which is converted into an insulator by light irradiation, for example. Next, there is arranged a plurality of linear devices 363 on the photoreactive organic film 362. The linear devices to be arranged include only non-defective ones selected by previously achieving a DC test or functional test by a special test apparatus (FIGS. 23(a) and (c)). Next, light such as ultraviolet light is irradiated to the photoreactive organic film 362 through a mask 364 positionally aligned to electrode portions of the linear devices 363 (FIG. 23(d)). Next, evaporated by heating is a photoreaction initiator included in the photoreactive organic film, thereby forming electric conductor regions 365 and insulator regions 366 in the photoreactive organic film 362 (FIG. 23(e)).

Although the wiring formation method has been explained in FIG. 23 in a case where the linear devices are arranged on the planar substrate, it is also possible to fabricate an integrated circuit in a cylindrical or linear shape by arranging linear devices on a cylindrical substrate or by arranging linear devices on a flexible substrate followed by deformation of the substrate into a cylindrical shape after formation of wirings.

EMBODIMENT

Although the present invention will be described in detail with reference to an embodiment, the present invention is not limited to such an embodiment.

Production Example 1

(Production of Complementary MISFET)

As an embodiment of a complementary MISFET of the present invention, there was fabricated a complementary MISFET represented by MISFET's 307 and 327 (FIG. 16) each including a central fiber comprising an insulator, as well as a gate electrode, a gate insulator region, a source region, a drain region, and a semiconductor region, successively arranged outwardly of the central fiber.

(Production of P-type MISFET)

(Formation of Central Fiber)

PMMA (polymethylmethacrylate) was adopted as a material of the central fiber. Firstly, 300 ml of a dimethylformaldehyde solution (5 wt %) of PMMA was vacuum dried and brought into a film-like solid. This film-like solid was cut into lines having diameters of several mm, and the lines comprising the cut PMMA were extruded by a melt extruder (manufactured by Imoto Machinery Co., Ltd.) into a fiber shape having a diameter of about 0.05 mm.

(Formation of Gate Electrode)

Used as a material of gate electrode line was MEH-PPV (poly-3-hexylthiophene) produced by Aldrich. Firstly, prepared in a 300 ml beaker was a toluene solution of MEH-PPV (10 wt %), and 50 ml of an iodine solution was added thereinto, followed by ultrasonic stirring. The central fiber comprising PMMA was immersed therein, followed by drying at 80° C. to form a gate electrode film having a film thickness of 1m on the surface of the central fiber, thereby fabricating a gate electrode line.

(Formation of Gate Insulator Region)

The gate electrode line was immersed into a dimethylformaldehyde solution including 1 wt % of polyvinylidene fluoride, followed by drying at 80° C., thereby forming a polyvinylidene fluoride film having a thickness of 1 μm on a surface of the gate electrode line.

(Formation of Source and Drain Regions)

Prepared in a 300 ml beaker was a xylene solution of MEH-PPV (10 wt %), and 50 ml of an iodine solution was added thereinto, followed by ultrasonic stirring. It was followed by vacuum drying and brought into a film-like solid. This film-like solid was cut into lines having diameters of several mm, and the lines comprising the cut MEH-PPV were extruded by a melt extruder (manufactured by Imoto Machinery Co., Ltd.) into a fiber shape having a diameter of about 0.2 mm. There were prepared four fibers therefrom each having a length of about 10 cm.

The two and two lines made of MEH-PPV to be established into a source region and a drain region, respectively, were arranged on the gate electrode line having its surface formed with the gate insulating region. Ends of the lines were fixed by an epoxy resin. This was followed by a heat treatment at 200° C. for 1 hour in a nitrogen atmosphere, thereby welding the source and drain regions to the gate insulating region.

(Formation of Semiconductor Region)

The linear body having a surface formed with the source and drain regions was immersed into a formic acid solution of polypyridine (PPy), followed by drying at 80° C. for 24 hours in a nitrogen atmosphere.

(Formation of Separation Region)

The linear body formed with the semiconductor regions was immersed into a dimethylformaldehyde solution (5 wt %) of PMMA (polymethylmethacrylate), followed by drying at 80° C. for 24 hours in a nitrogen atmosphere, thereby completing a P-type MISFET.

(Production of N-type MISFET)

(Formation of Central Fiber)

PMMA (polymethylmethacrylate) was adopted as a material of the central fiber. Firstly, 300 ml of a dimethylformaldehyde solution (5 wt %) of PMMA was vacuum dried and brought into a film-like solid. This film-like solid was cut into lines having diameters of several mm, and the lines comprising the cut PMMA were extruded by a melt extruder (manufactured by Imoto Machinery Co., Ltd.) into a fiber shape having a diameter of about 0.05 mm.

(Formation of Gate Electrode)

Used as a material of gate electrode line was MEH-PPV (poly-3-hexylthiophene) produced by Aldrich. Firstly, prepared in a 300 ml beaker was a toluene solution of MEH-PPV (10 wt %), and 50 ml of an iodine solution was added thereinto, followed by ultrasonic stirring. The central fiber comprising PMMA was immersed therein, followed by drying at 80° C. to form a gate electrode film having a film thickness of 1 μm on the surface of the central fiber, thereby fabricating a gate electrode line.

(Formation of Gate Insulator Region)

The gate electrode line was immersed into a dimethylformaldehyde solution including 1 wt % of polyvinylidene fluoride, followed by drying at 80° C., thereby forming a polyvinylidene fluoride film having a thickness of 1 μm on a surface of the gate electrode line.

(Formation of Source and Drain Regions)

Prepared in a 300 ml beaker was a xylene solution of MEH-PPV (10 wt %), and 50 ml of an iodine solution was added thereinto, followed by ultrasonic stirring. It was followed by vacuum drying and brought into a film-like solid. This film-like solid was cut into lines having diameters of several mm, and the lines comprising the cut MEH-PPV were extruded by a melt extruder (manufactured by Imoto Machinery Co., Ltd.) into a fiber shape having a diameter of about 0.2 mm. There were prepared four fibers therefrom each having a length of about 10 cm.

The two and two lines made of MEH-PPV to be established into a source region and a drain region, respectively, were arranged on the gate electrode line having its surface formed with the gate insulating region. Ends of the lines were fixed by an epoxy resin. This was followed by a heat treatment at 200° C. for 1 hour in a nitrogen atmosphere, thereby welding the source and drain regions to the gate insulating region.

(Formation of Semiconductor Region)

The linear body having a surface formed with the source and drain regions was immersed into a toluene solution of P3HT, followed by drying at 80° C. for 24 hours in a nitrogen atmosphere.

(Formation of Separation Region)

The linear body formed with the semiconductor regions was immersed into a dimethylformaldehyde solution (5 wt %) of PMMA (polymethylmethacrylate), followed by drying at 80° C. for 24 hours in a nitrogen atmosphere, thereby completing an N-type MISFET.

(Evaluation of Electric Characteristics of Complementary MISFET)

The P-type MISFET and N-type MISFET fabricated in the production example were adhered onto a planar substrate of 1 cm×1 cm, and the fibers of them were each cut to have a length, i.e., a channel width W of 2 mm; gold lines were attached to the gate electrodes, source regions, drain regions, and semiconductor regions, at the ends, respectively; and they were set in a darkroom to measure drain current characteristics of the P-type MISFET and N-type MISFET by a semiconductor parameter measuring apparatus (4155 made by Agilent Technologies).

There were measured drain currents of the P-type MISFET and N-type MISFET, and gate voltage dependency and drain voltage dependency were plotted in a graph. Concerning the P-type MISFET, the drain current was measured by setting a gate voltage at −4V and −10V, and changing a drain voltage from −5V to 10V. Concerning the N-type MISFET, the drain current was measured by setting a gate voltage at 4V and 10V, and changing a drain voltage from −5V to 10V. Potentials of the semiconductor regions were equalized to those of the source regions, respectively. As a result, it was appreciable in the P-type MISFET that the drain current was increased as an absolute value of the negative gate voltage was increased. Further, it was appreciable in the N-type MISFET that the drain current was increased as an absolute value of the positive gate voltage was increased.

INDUSTRIAL APPLICABILITY (1) There can be avoided occurrence of latch-up, by forming a complementary MISFET by electrically separating a linear body including an N-type MISFET and a linear body including a P-type MISFET from each other.

(2) There is obtained an effect of a decreased production cost by a decreased material cost, a simplified production process, and the like, in a manner that electroconductive regions, semiconductor regions, and/or insulator regions constituting complementary MISFET's or integrated circuits are formed of an organic semiconductor or electroconductive polymer.

(3) Linear bodies can be electrically separated from one another by simple coating or vapor deposition of an insulating material, thereby enabling achievement of device separation by a simplified process.

(4) By virtue of the structure where the cross section having the plurality of regions for forming a circuit element is continuously or intermittently formed in the longitudinal direction, it is possible to produce a linear device(s) having the plurality of regions in a simple process such as by extrusion forming or extension forming.

(5) Planar integrated circuit(s) fabricated by weaving or braiding the linear bodies is/are flexible, thin in thickness, and light-weighted, and thus can be utilized as an electronic device to be used in thin equipment, portable equipment, and the like.

(6) Linear integrated circuit(s) fabricated by bundling up the linear bodies is/are flexible, thin in diameter, and light-weighted, and thus can be utilized as an electronic device to be used in linear parts or linear apparatus such as wiring cords, fiberscopes, and the like.

(7) Without limited to the linear bodies laid out in a two-dimensional plane shape, planes each including the linear bodies laid out therein may be stacked, or the linear bodies themselves may be stacked to form a three-dimensional integrated circuit(s), thereby enabling a drastically improved degree of integration.

(8) Integrated circuit(s) can be fabricated by combining the linear bodies with one another, thereby enabling production of a large-sized device by combining a large number of linear bodies, independently of a scale of production equipment. Particularly, it is also possible to drastically increase a storage capacity of a semiconductor memory.

(9) In case of production of an integrated circuit(s) by using the plurality of linear bodies, the integrated circuit(s) can be produced by inspecting the linear bodies and adopting only the non-defective ones selected before production. Alternatively, it is even possible to conduct an inspection after production of an integrated circuit(s) and replace only linear bodies at defective portions, thereby enabling improvement of a production yield in case of an upsized integrated circuit(s) without conducting a process management so strictly.

(10) In case that the linear body constituting the circuit elements is simultaneously formed with a linear photoelectric conversion device such as a light emitting device, displaying device, photocell, photosensor, and the like, the photoelectric conversion device is allowed to have an increased surface area to effectively improve a photoelectric conversion efficiency, by causing the linear device to have a cross-sectional shape which is polygonal, star-shaped, crescent-shaped, petal-shaped, character-shaped, and so on having an increased surface area.

The invention claimed is:

1. A complementary MISFET comprising:
   a first linear body including an N-type MISFET;
   a second linear body including a P-type MISFET; and
   a separation region arranged between said first linear body and said second linear body,
   a plurality of cross sections formed in said first linear body and said second linear body, each cross section having plural regions for forming said MISFET is continuously or intermittently formed in the longitudinal direction.

2. The complementary MISFET of claim 1, wherein at least one of said linear bodies and said separation region is formed of a material made of an organic semiconductor or electroconductive polymer.

3. An integrated circuit comprising the complementary MISFET of claim 1.

4. The integrated circuit of claim 3, wherein said linear body has a cross section in a circular, polygonal, star, crescent, petal, character shape, or another arbitrary shape.

5. The complementary MISFET of claim 1, wherein said linear bodies and/or said separation region are formed of a material made of an organic semiconductor or electroconductive polymer.

6. An integrated circuit comprising the complementary MISFET of claim 1.

7. An integrated circuit comprising the complementary MISFET of claim 2.

8. The complementary MISFET of claim 2, wherein the separation region is constituted from an insulating material formed between the plural linear bodies.

9. The complementary MISFET of claim 8, wherein the insulating material is formed between the plural linear bodies by coating or vapor depositing.

10. The complementary MISFET of claim 2, wherein the separation region is constituted from an insulating film formed on a surface of the linear body.

* * * * *